(12) United States Patent
Kim et al.

(10) Patent No.: US 10,446,916 B2
(45) Date of Patent: Oct. 15, 2019

(54) MOBILE TERMINAL

(71) Applicant: LG ELECTRONICS INC., Seoul (KR)

(72) Inventors: Dongjin Kim, Seoul (KR); Changil Kim, Seoul (KR); Moonsoo Song, Seoul (KR); Namyong Kim, Seoul (KR)

(73) Assignee: LG ELECTRONICS INC., Seoul (KR)

( * ) Notice: Subject to any disclaimer, the term of this patent is extended or adjusted under 35 U.S.C. 154(b) by 0 days.

(21) Appl. No.: 16/327,122

(22) PCT Filed: Sep. 20, 2016

(86) PCT No.: PCT/KR2016/010487
§ 371 (c)(1),
(2) Date: Feb. 21, 2019

(87) PCT Pub. No.: WO2018/038311
PCT Pub. Date: Mar. 1, 2018

(65) Prior Publication Data
US 2019/0214706 A1 Jul. 11, 2019

(30) Foreign Application Priority Data

Aug. 22, 2016 (KR) .................. 10-2016-0105948

(51) Int. Cl.
*H04M 1/00* (2006.01)
*H01Q 1/24* (2006.01)
(Continued)

(52) U.S. Cl.
CPC .............. *H01Q 1/243* (2013.01); *H04M 1/02* (2013.01); *H04M 1/0262* (2013.01);
(Continued)

(58) Field of Classification Search
CPC .......... H01Q 1/243; H01Q 1/38; H01Q 5/328; H01Q 1/42; H04M 1/0266; H04M 1/026;
(Continued)

(56) References Cited

U.S. PATENT DOCUMENTS 9,203,141 B1 * 12/2015 Su ........................... H01Q 7/00
2014/0062801 A1 3/2014 Yong et al.
(Continued)

FOREIGN PATENT DOCUMENTS

KR 10-2012-0119834 A 10/2012
KR 10-2014-0097849 A 8/2014
(Continued)

*Primary Examiner* — Khalid W Shaheed
(74) *Attorney, Agent, or Firm* — Birch, Stewart, Kolasch & Birch, LLP

(57) ABSTRACT

Disclosed is a mobile terminal comprising: a housing including a rear case positioned on a rear surface thereof and a side case positioned on a side surface thereof; a display unit disposed on a front surface of the housing; and a wireless communication unit, mounted on the main board, for processing a radio signal, wherein the side case includes a first metal part and a second metal part formed in a layered structure and spaced apart in the thickness direction of the first metal part and the housing, wherein the first metal part and the second metal part extend to a first side surface of the housing and to at least a portion of a second side surface and a third side surface located on the right and left sides of the first side surface, wherein at least one of the first metal part and the second metal part is connected to the wireless communication unit to transmit and receive an RF signal. The performance of the mobile terminal can be secured even when the performance of a mobile communication antenna is expanded and thus the mobile terminal is adjacent.

18 Claims, 19 Drawing Sheets

(51) Int. Cl.
  *H04M 1/02*  (2006.01)
  *H04W 88/06*  (2009.01)
  *H04B 1/00*  (2006.01)
  *H01Q 9/26*  (2006.01)
  *H01Q 9/42*  (2006.01)

(52) U.S. Cl.
  CPC ....... *H04M 1/0266* (2013.01); *H04M 1/0274* (2013.01); *H01L 2924/00014* (2013.01); *H01Q 1/245* (2013.01); *H01Q 9/26* (2013.01); *H01Q 9/42* (2013.01); *H04B 1/006* (2013.01); *H04W 88/06* (2013.01)

(58) Field of Classification Search
  CPC .... H04M 1/0262; H04M 1/0274; H04B 1/38; H01L 2924/00014; H04W 88/06
  See application file for complete search history.

(56) References Cited

U.S. PATENT DOCUMENTS

2014/0152890 A1* 6/2014 Rayner ................ G06F 1/1626
                                                348/376
2016/0134730 A1* 5/2016 Lee ...................... H04M 1/026
                                                455/552.1

FOREIGN PATENT DOCUMENTS

KR    10-2015-0117161 A    10/2015
KR    10-2016-0023438 A     3/2016

\* cited by examiner (b)

(a)

(b)

MOBILE TERMINAL

CROSS-REFERENCE TO RELATED APPLICATIONS

This application is the National Phase of PCT International Application No. PCT/KR2016/010487, filed on Sep. 20, 2016, which claims priority under 35 U.S.C. 119(a) to Patent Application No. 10-2016-0105948, filed in Republic of Korea on Aug. 22, 2016, all of which are hereby expressly incorporated by reference into the present application.

BACKGROUND OF THE INVENTION

Field of the Invention

Embodiments of the present disclosure relate to a mobile terminal that uses a side case as an antenna.

Discussion of the Related Art

Terminals may be generally classified as mobile/portable terminals or stationary terminals according to their mobility. Mobile terminals may also be classified as handheld terminals or vehicle mounted terminals according to whether or not a user can directly carry the terminal.

Mobile terminals have become increasingly more functional. Examples of such functions include data and voice communications, capturing images and video via a camera, recording audio, playing music files via a speaker system, and displaying images and video on a display. Some mobile terminals include additional functionality which supports game playing, while other terminals are configured as multimedia players. More recently, mobile terminals have been configured to receive broadcast and multicast signals which permit viewing of content such as videos and television programs.

As such functions become more diversified, the mobile terminal can support more complicated functions such as capturing images or video, reproducing music or video files, playing games, receiving broadcast signals, and the like. By comprehensively and collectively implementing such functions, the mobile terminal may be embodied in the form of a multimedia player or device.

The display unit including a touch sensor may have an input function as well as an output function. Accordingly, as the multimedia function is expanded, the display tends to become larger and larger and the bezel tends to become smaller and smaller.

However, if the display becomes larger with the bezel becoming smaller, the space of the bezel for loading electronic components results in becoming reduced and the space for losing some components, especially, an antenna affected by peripheral components a lot could be restricted.

SUMMARY OF THE INVENTION

To overcome the disadvantages, an object of the present invention is to address the above-noted and other problems and provide a mobile terminal which may use a side case as an antenna to secure an antenna function even if a small bezel is provided.

To achieve these objects and other advantages and in accordance with the purpose of the embodiments, as embodied and broadly described herein, a mobile terminal comprising: a housing comprising a rear case provided in a rear surface and a side case provided in a lateral surface; a display unit disposed on a front surface of the housing; a window glass configured to cover the display unit and the front surface of the housing; a main board loaded in the housing; and a wireless communication unit loaded in the main board and configured to process a wireless signal, wherein the side case comprises a first metal part; and a second metal part forming a layered structure along the thickness of the housing, together with the first metal part, and the first metal part and the second metal part are extended to a predetermined area of a first lateral surface, a second lateral surface located in left and right sides of the first lateral surface and a third lateral surface, and one of the first and second metal parts is connected with the wireless communication unit and configured to transceive a RF signal.

The side case may further include a first non-metal part provided between the first metal part and the second metal part, and the first metal part, the first non-metal part and the second metal part forms a layered structure along the thickness of the mobile terminal.

The mobile terminal may further comprise a hole formed in the first non-metal part; and one or more of an interface and an earphone jack that are arranged in the hole.

The mobile terminal may further comprise a feed line connected with the second metal part and configured to transceive a FR signal, wherein both ends of the first non-metal part are bent towards the second metal part and extended to both ends of the second metal part.

The side case may further comprise a pair of third metal parts provided to connect the first metal part and both ends of the second metal part.

The side case may further comprise a fourth metal part spaced apart from the first metal part, the second metal part and the third metal part; and a second non-metal part disposed between the third metal part and the fourth metal part.

The mobile terminal may further comprise a feed line connected with the second metal part and configured to transceive a RF signal; and a first ground line connected with the first metal part and configured to ground.

A signal may be transceived at a frequency having a length L1 from the feed line to the second metal part, the third metal part, the first metal part and the first ground line in a first direction or a length L2 to the second metal part, the third metal part, the first metal part and the first ground line in a second direction or a doubled length of L1 and L2.

A different between the length L1 from the feed line to the second metal part, the third metal part, the first metal part and the first ground line in the first direction and the length L2 to the second metal part, the third metal part, the first metal part and the first ground line in a second direction may be 10% or less.

The mobile terminal may further comprise a conductive pattern having both ends connected with the second metal part; and a second ground line connected with the conductive pattern and configured to ground.

The conductive pattern may be formed in an inner surface of the rear case.

The length from the feed line to the second metal part, the conductive pattern and the second ground line may be corresponding to the length from the feed line to the second metal part, the third metal part, the first metal part and the first ground line.

The mobile terminal may further comprise a middle frame formed of metal and disposed on a rear surface of the display unit, wherein the conductive pattern and the second ground line are formed by cutting away a predetermined area of the middle frame.

The mobile terminal may further comprise a lower unit provided in a direction in which the first metal part and the second metal part of the housing are formed; and a battery projected from the lower unit and inserted in a space between the first metal part and the second metal part.

The mobile terminal may further comprise a flexible substrate configured to connect the second metal part with the main board, wherein the flexible substrate comprises a feed line connected with the second metal part and configured to transceive a RF signal; a conductive pattern having both ends contacting with the second metal part; and a second ground line connected with the conductive pattern and configured to ground.

The mobile terminal may further comprise a first feed line and a second feed line connected with the first metal part and the second metal part, respectively, and configured to transceive a RF signal; and a first ground line and a second ground line connected with the first metal part and the second metal part, respectively, and configured to ground, wherein the first metal part and the second metal part are continuously formed around the lateral surface of the mobile terminal in a ring shape The wireless communication unit may transceive a RF signal having a corresponding wavelength to the length of the first metal part from the first feed line and the first ground line or the length of the second metal part from the second feed line to the second ground line.

The side case may further comprise a first non-metal part provided between the first metal part and the second metal part and formed in a ring shape.

Advantageous Effects

Accordingly, the embodiments have following advantageous effects. According to the embodiments of the present disclosure, the mobile terminal can expand the antenna function and then secure the antenna function even the antenna is provided near peripheral components.

Furthermore, the mobile terminal can realize the plurality of antenna radiators having independent paths, respectively, and then control another radiator to transceive a signal even if the performance of one radiator is deteriorated. Accordingly, the wireless communication function of the mobile terminal may be enhanced.

Further scope of applicability of the present invention will become apparent from the detailed description given hereinafter. However, it should be understood that the detailed description and specific examples, while indicating preferred embodiments of the invention, are given by illustration only, since various changes and modifications within the spirit and scope of the invention will become apparent to those skilled in the art from this detailed description.

DESCRIPTION OF SPECIFIC EMBODIMENTS

Figure 1A:
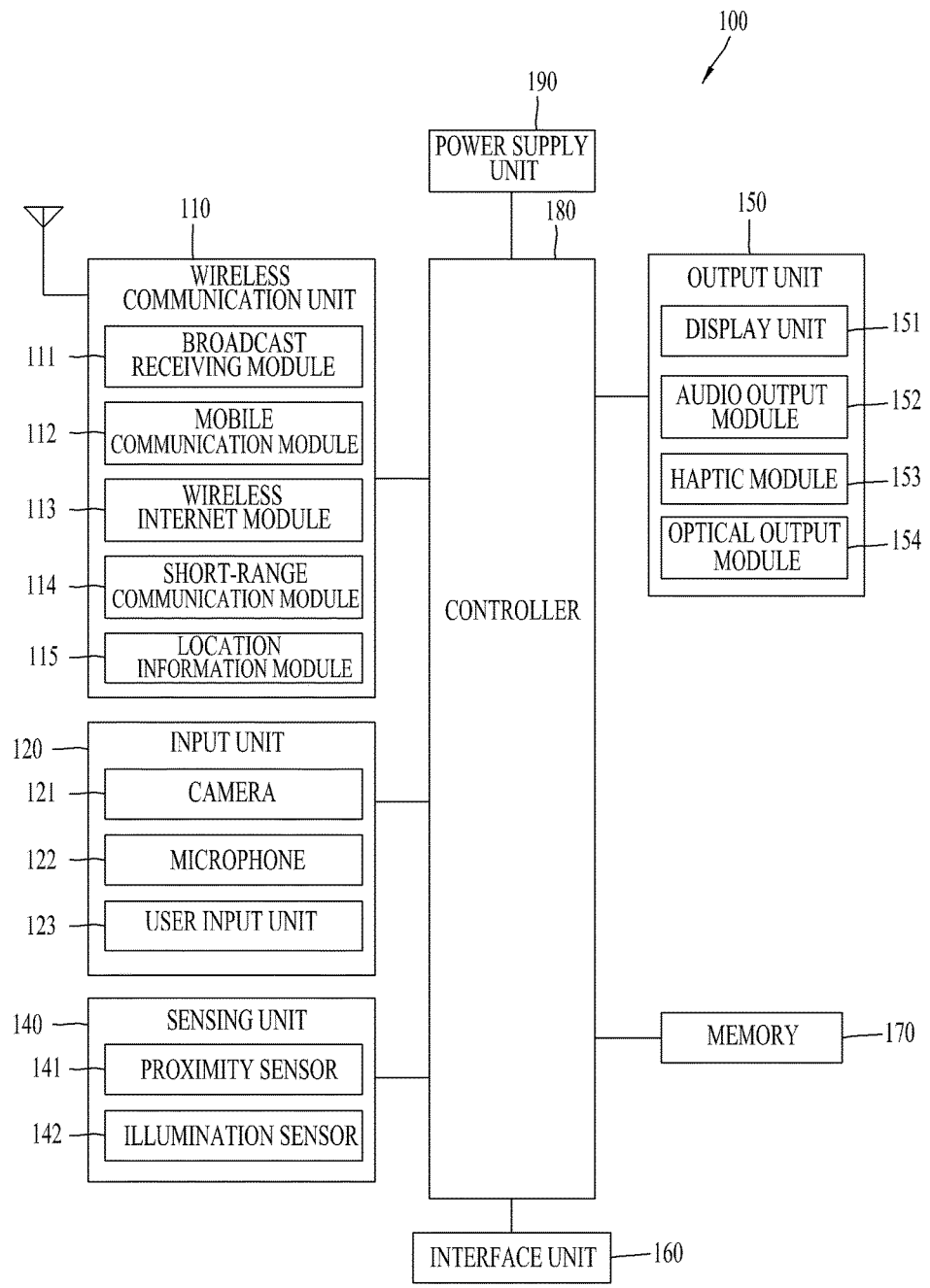
FIG. 1A is a block diagram of a mobile terminal in accordance with the present disclosure.

Description will now be given in detail according to exemplary embodiments disclosed herein, with reference to the accompanying drawings. For the sake of brief description with reference to the drawings, the same or equivalent components may be provided with the same reference numbers, and description thereof will not be repeated. In general, a suffix such as "module" and "unit" may be used to refer to elements or components. Use of such a suffix herein is merely intended to facilitate description of the specification, and the suffix itself is not intended to give any special meaning or function. In the present disclosure, that which is well-known to one of ordinary skill in the relevant art has generally been omitted for the sake of brevity. The accompanying drawings are used to help easily understand various technical features and it should be understood that the embodiments presented herein are not limited by the accompanying drawings. As such, the present disclosure should be construed to extend to any alterations, equivalents and substitutes in addition to those which are particularly set out in the accompanying drawings.

It will be understood that although the terms first, second, etc. may be used herein to describe various elements, these elements should not be limited by these terms. These terms are generally only used to distinguish one element from another.

It will be understood that when an element is referred to as being "connected with" another element, the element can be directly connected with the other element or intervening elements may also be present. In contrast, when an element is referred to as being "directly connected with" another element, there are no intervening elements present.

A singular representation may include a plural representation unless it represents a definitely different meaning from the context.

Terms such as "include" or "has" are used herein and should be understood that they are intended to indicate an existence of several components, functions or steps, disclosed in the specification, and it is also understood that greater or fewer components, functions, or steps may likewise be utilized.

Mobile terminals presented herein may be implemented using a variety of different types of terminals. Examples of such terminals include cellular phones, smart phones, user equipment, laptop computers, digital broadcast terminals, personal digital assistants (PDAs), portable multimedia players (PMPs), navigators, portable computers (PCs), slate PCs, tablet PCs, ultra books, wearable devices (for example, smart watches, smart glasses, head mounted displays (HMDs)), and the like.

By way of non-limiting example only, further description will be made with reference to particular types of mobile terminals. However, such teachings apply equally to other types of terminals, such as those types noted above. In addition, these teachings may also be applied to stationary terminals such as digital TV, desktop computers, and the like.

Figure 1B:
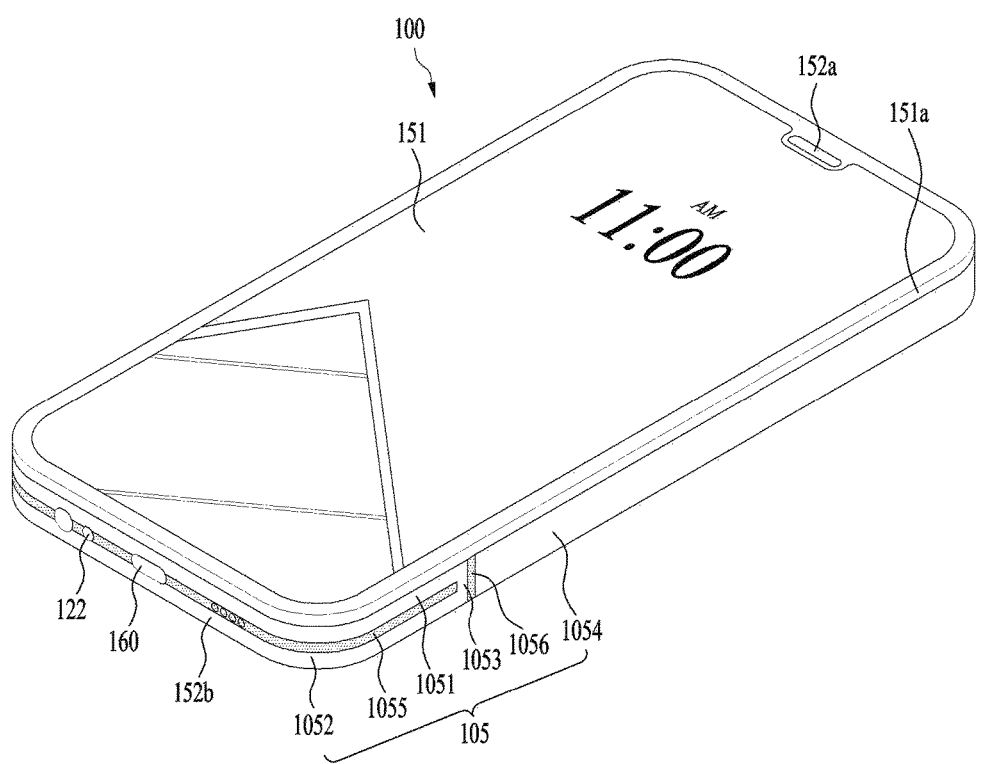
FIGS. 1B and 1C are conceptual views of one example of the mobile terminal, viewed from different directions.
Figure 1C:
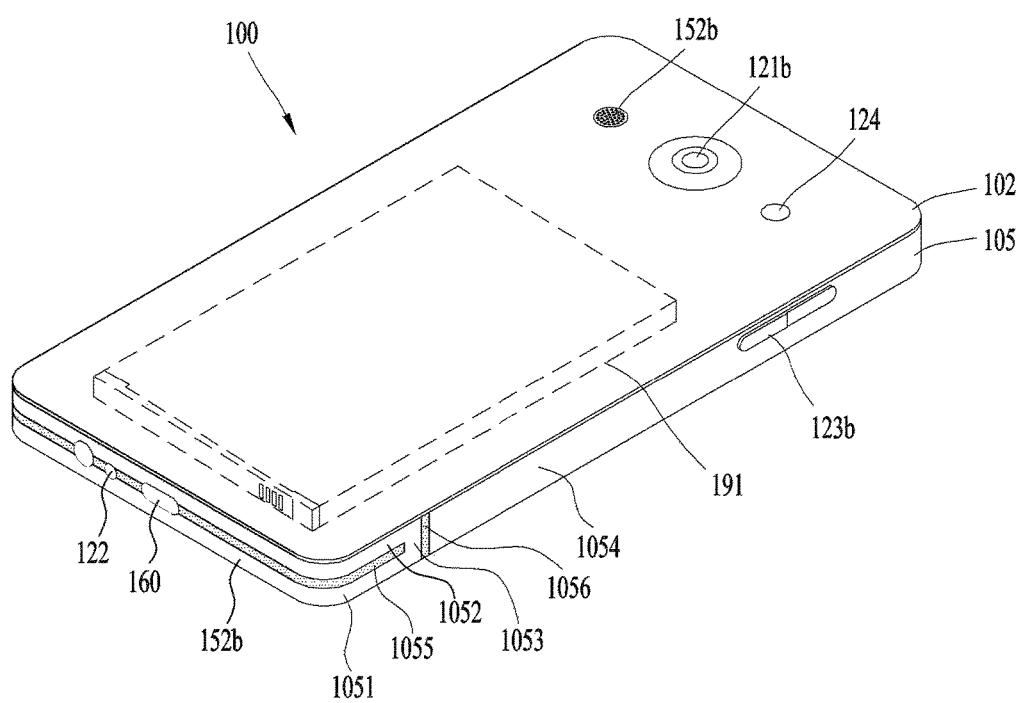

Reference is now made to FIGS. 1A-1C, where FIG. 1A is a block diagram of a mobile terminal in accordance with the present disclosure, and FIGS. 1B and 1C are conceptual views of one example of the mobile terminal, viewed from different directions.

The mobile terminal 100 is shown having components such as a wireless communication unit 110, an input unit 120, a sensing unit 140, an output unit 150, an interface unit 160, a memory 170, a controller 180, and a power supply unit 190. It is understood that implementing all of the illustrated components in The FIG. 1A is not a requirement, and that greater or fewer components may alternatively be implemented.

More specifically, the wireless communication unit 110 typically includes one or more modules which permit communications such as wireless communications between the mobile terminal 100 and a wireless communication system, communications between the mobile terminal 100 and another mobile terminal, communications between the mobile terminal 100 and an external server. Further, the wireless communication unit 110 typically includes one or more modules which connect the mobile terminal 100 to one or more networks.

To facilitate such communications, the wireless communication unit 110 includes one or more of a broadcast receiving module 111, a mobile communication module 112, a wireless Internet module 113, a short-range communication module 114, and a location information module 115.

The broadcast managing entity may be implemented using a server or system which generates and transmits a broadcast signal and/or broadcast associated information, or a server which receives a pre-generated broadcast signal and/or broadcast associated information, and sends such items to the mobile terminal. The broadcast signal may be implemented using any of a TV broadcast signal, a radio broadcast signal, a data broadcast signal, and combinations thereof, among others. The broadcast signal in some cases may further include a data broadcast signal combined with a TV or radio broadcast signal.

The broadcast signal may be encoded according to any of a variety of technical standards or broadcasting methods (for example, International Organization for Standardization (ISO), International Electrotechnical Commission (IEC), Digital Video Broadcast (DVB), Advanced Television Systems Committee (ATSC), and the like) for transmission and reception of digital broadcast signals. The broadcast receiving module 111 can receive the digital broadcast signals using a method appropriate for the transmission method utilized.

Examples of broadcast associated information may include information associated with a broadcast channel, a broadcast program, a broadcast event, a broadcast service provider, or the like. The broadcast associated information may also be provided via a mobile communication network, and in this case, received by the mobile communication module 112.

The broadcast associated information may be implemented in various formats. For instance, broadcast associated information may include an Electronic Program Guide (EPG) of Digital Multimedia Broadcasting (DMB), an Electronic Service Guide (ESG) of Digital Video Broadcast-Handheld (DVB-H), and the like. Broadcast signals and/or broadcast associated information received via the broadcast receiving module 111 may be stored in a suitable device, such as a memory 170.

The mobile communication module 112 can transmit and/or receive wireless signals to and from one or more network entities. Typical examples of a network entity include a base station, an external mobile terminal, a server, and the like. Such network entities form part of a mobile communication network, which is constructed according to technical standards or communication methods for mobile communications (for example, Global System for Mobile Communication (GSM), Code Division Multi Access (CDMA), CDMA2000 (Code Division Multi Access 2000), EV-DO (Enhanced Voice-Data Optimized or Enhanced Voice-Data Only), Wideband CDMA (WCDMA), High Speed Downlink Packet access (HSDPA), HSUPA (High Speed Uplink Packet Access), Long Term Evolution (LTE), LTE-A (Long Term Evolution-Advanced), and the like).

Examples of wireless signals transmitted and/or received via the mobile communication module 112 include audio call signals, video (telephony) call signals, or various formats of data to support communication of text and multimedia messages.

The wireless Internet module 113 is configured to facilitate wireless Internet access. This module may be internally or externally coupled to the mobile terminal 100. The wireless Internet module 113 may transmit and/or receive wireless signals via communication networks according to wireless Internet technologies.

Examples of such wireless Internet access include Wireless LAN (WLAN), Wireless Fidelity (Wi-Fi), Wi-Fi Direct, Digital Living Network Alliance (DLNA), Wireless Broadband (WiBro), Worldwide Interoperability for Microwave Access (WiMAX), High Speed Downlink Packet Access (HSDPA), HSUPA (High Speed Uplink Packet Access), Long Term Evolution (LTE), LTE-A (Long Term Evolution-Advanced), and the like. The wireless Internet module 113 may transmit/receive data according to one or more of such wireless Internet technologies, and other Internet technologies as well.

In some embodiments, when the wireless Internet access is implemented according to, for example, WiBro, HSDPA, HSUPA, GSM, CDMA, WCDMA, LTE, LTE-A and the like, as part of a mobile communication network, the wireless Internet module 113 performs such wireless Internet access. As such, the Internet module 113 may cooperate with, or function as, the mobile communication module 112.

The short-range communication module 114 is configured to facilitate short-range communications. Suitable technologies for implementing such short-range communications include BLUETOOTH™, Radio Frequency IDentification (RFID), Infrared Data Association (IrDA), Ultra-WideBand (UWB), ZigBee, Near Field Communication (NFC), Wireless-Fidelity (Wi-Fi), Wi-Fi Direct, Wireless USB (Wireless Universal Serial Bus), and the like. The short-range communication module 114 in general supports wireless communications between the mobile terminal 100 and a wireless communication system, communications between the mobile terminal 100 and another mobile terminal 100, or communications between the mobile terminal and a network where another mobile terminal 100 (or an external server) is located, via wireless area networks. One example of the wireless area networks is a wireless personal area networks.

In some embodiments, another mobile terminal (which may be configured similarly to mobile terminal 100) may be a wearable device, for example, a smart watch, a smart glass or a head mounted display (HMD), which is able to exchange data with the mobile terminal 100 (or otherwise cooperate with the mobile terminal 100). The short-range communication module 114 may sense or recognize the wearable device, and permit communication between the wearable device and the mobile terminal 100. In addition, when the sensed wearable device is a device which is authenticated to communicate with the mobile terminal 100, the controller 180, for example, may cause transmission of data processed in the mobile terminal 100 to the wearable device via the short-range communication module 114. Hence, a user of the wearable device may use the data processed in the mobile terminal 100 on the wearable device. For example, when a call is received in the mobile terminal 100, the user may answer the call using the wearable device. Also, when a message is received in the mobile terminal 100, the user can check the received message using the wearable device.

The location information module 115 is generally configured to detect, calculate, derive or otherwise identify a position of the mobile terminal. As an example, the location information module 115 includes a Global Position System (GPS) module, a Wi-Fi module, or both. If desired, the location information module 115 may alternatively or additionally function with any of the other modules of the wireless communication unit 110 to obtain data related to the position of the mobile terminal. As one example, when the mobile terminal uses a GPS module, a position of the mobile terminal may be acquired using a signal sent from a GPS satellite. As another example, when the mobile terminal uses the Wi-Fi module, a position of the mobile terminal can be acquired based on information related to a wireless access point (AP) which transmits or receives a wireless signal to or from the Wi-Fi module. The input unit 120 includes a camera 121 for obtaining images or video, a microphone 122, which is one type of audio input device for inputting an audio signal, and a user input unit 123 (for example, a touch key, a push key, a mechanical key, a soft key, and the like) for allowing a user to input information. Data (for example, audio, video, image, and the like) is obtained by the input unit 120 and may be analyzed and processed by controller 180 according to device parameters, user commands, and combinations thereof.

The sensing unit 140 is typically implemented using one or more sensors configured to sense internal information of the mobile terminal, the surrounding environment of the mobile terminal, user information, and the like. For example, the sensing unit 140 may alternatively or additionally include other types of sensors or devices, such as a proximity sensor 141 and an illumination sensor 142, a touch sensor, an acceleration sensor, a magnetic sensor, a G-sensor, a gyroscope sensor, a motion sensor, an RGB sensor, an infrared (IR) sensor, a finger scan sensor, a ultrasonic sensor, an optical sensor (for example, camera 121), a microphone 122, a battery gauge, an environment sensor (for example, a barometer, a hygrometer, a thermometer, a radiation detection sensor, a thermal sensor, and a gas sensor, among others), and a chemical sensor (for example, an electronic nose, a health care sensor, a biometric sensor, and the like), to name a few. The mobile terminal 100 may be configured to utilize information obtained from sensing unit 140, and in particular, information obtained from one or more sensors of the sensing unit 140, and combinations thereof.

The output unit 150 is typically configured to output various types of information, such as audio, video, tactile output, and the like. The output unit 150 is shown having a display unit 151, an audio output module 152, a haptic module 153, and an optical output module 154. The display unit 151 may have an inter-layered structure or an integrated structure with a touch sensor in order to facilitate a touch screen. The touch screen may provide an output interface between the mobile terminal 100 and a user, as well as function as the user input unit 123 which provides an input interface between the mobile terminal 100 and the user.

The interface unit 160 serves as an interface with various types of external devices that can be coupled to the mobile terminal 100. The interface unit 160, for example, may include any of wired or wireless ports, external power supply ports, wired or wireless data ports, memory card ports, ports for connecting a device having an identification module, audio input/output (I/O) ports, video I/O ports, earphone ports, and the like. In some cases, the mobile terminal 100 may perform assorted control functions associated with a connected external device, in response to the external device being connected to the interface unit 160.

The memory 170 is typically implemented to store data to support various functions or features of the mobile terminal 100. For instance, the memory 170 may be configured to store application programs executed in the mobile terminal 100, data or instructions for operations of the mobile terminal 100, and the like. Some of these application programs may be downloaded from an external server via wireless communication. Other application programs may be installed within the mobile terminal 100 at time of manufacturing or shipping, which is typically the case for basic functions of the mobile terminal 100 (for example, receiving a call, placing a call, receiving a message, sending a message, and the like). It is common for application programs to be stored in the memory 170, installed in the mobile terminal 100, and executed by the controller 180 to perform an operation (or function) for the mobile terminal 100.

The controller 180 typically functions to control overall operation of the mobile terminal 100, in addition to the operations associated with the application programs. The controller 180 may provide or process information or functions appropriate for a user by processing signals, data, information and the like, which are input or output, or activating application programs stored in the memory 170.

To drive the application programs stored in the memory 170, the controller 180 may be implemented to control a predetermined number of the components mentioned above in reference with FIG. 1A. Moreover, the controller 180 may be implemented to combinedly operate two or more of the components provided in the mobile terminal 100 to drive the application programs.

The power supply unit 190 can be configured to receive external power or provide internal power in order to supply appropriate power required for operating elements and components included in the mobile terminal 100. The power supply unit 190 may include a battery, and the battery may be configured to be embedded in the terminal body, or configured to be detachable from the terminal body.

Some or more of the components may be operated cooperatively to embody an operation, control or a control method of the mobile terminal in accordance with embodiments of the present disclosure. Also, the operation, control or control method of the mobile terminal may be realized on the mobile terminal by driving of one or more application problems stored in the memory 170.

Referring now to FIGS. 1B and 1C, the mobile terminal 100 is described with reference to a bar-type terminal body. However, the mobile terminal 100 may alternatively be implemented in any of a variety of different configurations. Examples of such configurations include watch-type, clip-type, glasses-type, or as a folder-type, flip-type, slide-type, swing-type, and swivel-type in which two and more bodies are combined with each other in a relatively movable manner, and combinations thereof. Discussion herein will often relate to a particular type of mobile terminal (for example, bar-type, watch-type, glasses-type, and the like). However, such teachings with regard to a particular type of mobile terminal will generally apply to other types of mobile terminals as well.

Here, the terminal body may be understood to refer to the concept of this bore a mobile terminal (100) to at least one of the aggregate.

The mobile terminal 100 will generally include a case (for example, frame, housing, cover, and the like) forming the appearance of the terminal. In this embodiment, the case is formed using a front case 101 and a rear case 102. Various electronic components are incorporated into a space formed between the front case 101 and the rear case 102.

As shown in FIGS. 1B and 1C, the mobile terminal may additionally include a side case 105 for covering a lateral surface. The side case 105 may have a preset thickness or a partially variable thickness. The side case 105 may be formed of a mixture of metal and a non-metal material. When the side case 105 includes the metallic material, the metal part of the side case 105 may be provided with a RF signal from the wireless communication unit 110 and then used as an antenna radiator.

The display unit 151 is shown located on the front side of the terminal body to output information. As illustrated, a window 151*a* of the display unit 151 may be mounted to the front case 101 to form the front surface of the terminal body together with the front case 101. A window glass 151*a* may be arranged in a front surface of the display unit to cover the display unit 151 and some area of the front case. To form the unity of the exterior design, the window glass 151*a* may be used in covering an overall front area of the display unit. When the window glass 151*a* covers the overall area of the front surface, the front case may not be exposed outside or the front case may be omitted. Accordingly, the exterior design of the mobile terminal 100 may be realized neat and clean.

The mobile terminal 100 may further include a middle frame 104 for supporting a rear surface of the display unit 151. As the display unit 151 is arranged in a front surface of the middle frame 104, the front surface is flat. As the main board 181, the camera 121, the audio output unit 152*b*, the battery 191 and other various components are loaded in a rear surface of the middle frame 104, some uneven areas corresponding to the shapes of the components, respectively, may be formed in the rear surface. The middle frame 104 may include metal to function as a ground of each component and to reinforce the strength of the middle frame 104.

In some embodiments, electronic components may also be mounted to the rear case 102. Examples of such electronic components include a detachable battery 191, an identification module, a memory card, and the like. Rear cover 103 is shown covering the electronic components, and this cover may be detachably coupled to the rear case 102. Therefore, when the rear cover 103 is detached from the rear case 102, the electronic components mounted to the rear case 102 are externally exposed.

As illustrated, when the rear cover 103 is coupled to the rear case 102, a side surface of the rear case 102 is partially exposed. In some cases, upon the coupling, the rear case 102 may also be completely shielded by the rear cover 103. In some embodiments, the rear cover 103 may include an opening for externally exposing a camera 121*b* or an audio output module 152*b*.

The cases 101, 102, 103 may be formed by injection-molding synthetic resin or may be formed of a metal, for example, stainless steel (STS), aluminum (Al), titanium (Ti), or the like.

As an alternative to the example in which the plurality of cases form an inner space for accommodating components, the mobile terminal 100 may be configured such that one case forms the inner space. In this example, a mobile terminal 100 having a uni-body is formed in such a manner that synthetic resin or metal extends from a side surface to a rear surface.

If desired, the mobile terminal 100 may include a waterproofing unit (not shown) for preventing introduction of water into the terminal body. For example, the waterproofing unit may include a waterproofing member which is located between the window 151*a* and the front case 101, between the front case 101 and the rear case 102, or between the rear case 102 and the rear cover 103, to hermetically seal an inner space when those cases are coupled.

The mobile terminal 100 may include the display unit 151, the first and second audio output units 152*a* and 152*b*, the microphone 122, the interface unit 160 and the like.

It will be described for the mobile terminal as shown in FIGS. 1B and 1C. The display unit 151, the first audio output module 152*a*, the proximity sensor 141, an illumination sensor 142, the optical output module 154, the first camera 121*a* and the first manipulation unit 123*a* are arranged in front surface of the terminal body, the second manipulation unit 123*b*, the microphone 122 and interface unit 160 are arranged in side surface of the terminal body, and the second audio output modules 152b and the second camera 121b are arranged in rear surface of the terminal body.

It is to be understood that alternative arrangements are possible and within the teachings of the instant disclosure. Some components may be omitted or rearranged. For example, the first manipulation unit 123a may be located on another surface of the terminal body, and the second audio output module 152b may be located on the side surface of the terminal body.

The display unit 151 is generally configured to output information processed in the mobile terminal 100. For example, the display unit 151 may display execution screen information of an application program executing at the mobile terminal 100 or user interface (UI) and graphic user interface (GUI) information in response to the execution screen information.

The display unit 151 outputs information processed in the mobile terminal 100. The display unit 151 may be implemented using one or more suitable display devices. Examples of such suitable display devices include a liquid crystal display (LCD), a thin film transistor-liquid crystal display (TFT-LCD), an organic light emitting diode (OLED), a flexible display, a 3-dimensional (3D) display, an e-ink display, and combinations thereof.

The display unit 151 may be implemented using two display devices, which can implement the same or different display technology. For instance, a plurality of the display units 151 may be arranged on one side, either spaced apart from each other, or these devices may be integrated, or these devices may be arranged on different surfaces.

The display unit 151 may also include a touch sensor which senses a touch input received at the display unit. When a touch is input to the display unit 151, the touch sensor may be configured to sense this touch and the controller 180, for example, may generate a control command or other signal corresponding to the touch. The content which is input in the touching manner may be a text or numerical value, or a menu item which can be indicated or designated in various modes.

The touch sensor may be configured in a form of a film having a touch pattern, disposed between the window 151a and a display on a rear surface of the window 151a, or a metal wire which is patterned directly on the rear surface of the window 151a. Alternatively, the touch sensor may be integrally formed with the display. For example, the touch sensor may be disposed on a substrate of the display or within the display.

The display unit 151 may also form a touch screen together with the touch sensor. Here, the touch screen may serve as the user input unit 123 (see FIG. 1A). Therefore, the touch screen may replace at least some of the functions of the first manipulation unit 123a.

The first audio output module 152a may be implemented in the form of a speaker to output voice audio, alarm sounds, multimedia audio reproduction, and the like.

The window 151a of the display unit 151 will typically include an aperture to permit audio generated by the first audio output module 152a to pass. One alternative is to allow audio to be released along an assembly gap between the structural bodies (for example, a gap between the window 151a and the front case 101). In this case, a hole independently formed to output audio sounds may not be seen or is otherwise hidden in terms of appearance, thereby further simplifying the appearance and manufacturing of the mobile terminal 100.

The optical output module 154 can be configured to output light for indicating an event generation. Examples of such events include a message reception, a call signal reception, a missed call, an alarm, a schedule notice, an email reception, information reception through an application, and the like. When a user has checked a generated event, the controller can control the optical output unit 154 to stop the light output.

The first camera 121a can process image frames such as still or moving images obtained by the image sensor in a capture mode or a video call mode. The processed image frames can then be displayed on the display unit 151 or stored in the memory 170.

The first and second manipulation units 123a and 123b are examples of the user input unit 123, which may be manipulated by a user to provide input to the mobile terminal 100. The first and second manipulation units 123a and 123b may also be commonly referred to as a manipulating portion, and may employ any tactile method that allows the user to perform manipulation such as touch, push, scroll, or the like. The first and second manipulation units 123a and 123b may also employ any non-tactile method that allows the user to perform manipulation such as proximity touch, hovering, or the like.

FIG. 1B illustrates the first manipulation unit 123a as a touch key, but possible alternatives include a mechanical key, a push key, a touch key, and combinations thereof.

Input received at the first and second manipulation units 123a and 123b may be used in various ways. For example, the first manipulation unit 123a may be used by the user to provide an input to a menu, home key, cancel, search, or the like, and the second manipulation unit 123b may be used by the user to provide an input to control a volume level being output from the first or second audio output modules 152a or 152b, to switch to a touch recognition mode of the display unit 151, or the like.

As another example of the user input unit 123, a rear input unit (not shown) may be located on the rear surface of the terminal body. The rear input unit can be manipulated by a user to provide input to the mobile terminal 100. The input may be used in a variety of different ways. For example, the rear input unit may be used by the user to provide an input for power on/off, start, end, scroll, control volume level being output from the first or second audio output modules 152a or 152b, switch to a touch recognition mode of the display unit 151, and the like. The rear input unit may be configured to permit touch input, a push input, or combinations thereof.

The rear input unit may be located to overlap the display unit 151 of the front side in a thickness direction of the terminal body. As one example, the rear input unit may be located on an upper end portion of the rear side of the terminal body such that a user can easily manipulate it using a forefinger when the user grabs the terminal body with one hand. Alternatively, the rear input unit can be positioned at most any location of the rear side of the terminal body.

Embodiments that include the rear input unit may implement some or all of the functionality of the first manipulation unit 123a in the rear input unit. As such, in situations where the first manipulation unit 123a is omitted from the front side, the display unit 151 can have a larger screen.

As a further alternative, the mobile terminal 100 may include a finger scan sensor which scans a user's fingerprint. The controller 180 can then use fingerprint information sensed by the finger scan sensor as part of an authentication procedure. The finger scan sensor may also be installed in the display unit 151 or implemented in the user input unit 123.

The microphone 122 is shown located at an end of the mobile terminal 100, but other locations are possible. If desired, multiple microphones may be implemented, with such an arrangement permitting the receiving of stereo sounds.

The interface unit 160 may serve as a path allowing the mobile terminal 100 to interface with external devices. For example, the interface unit 160 may include one or more of a connection terminal for connecting to another device (for example, an earphone, an external speaker, or the like), a port for near field communication (for example, an Infrared Data Association (IrDA) port, a Bluetooth port, a wireless LAN port, and the like), or a power supply terminal for supplying power to the mobile terminal 100. The interface unit 160 may be implemented in the form of a socket for accommodating an external card, such as Subscriber Identification Module (SIM), User Identity Module (UIM), or a memory card for information storage.

The second camera 121b is shown located at the rear side of the terminal body and includes an image capturing direction that is substantially opposite to the image capturing direction of the first camera unit 121a. If desired, second camera 121a may alternatively be located at other locations, or made to be moveable, in order to have a different image capturing direction from that which is shown.

The second camera 121b can include a plurality of lenses arranged along at least one line. The plurality of lenses may also be arranged in a matrix configuration. The cameras may be referred to as an "array camera." When the second camera 121b is implemented as an array camera, images may be captured in various manners using the plurality of lenses and images with better qualities.

A flash 124 is shown located adjacent to the second camera 121b. When an image of a subject is captured with the camera 121b, the flash 124 may illuminate the subject.

The second audio output module 152b can be located on the terminal body. The second audio output module 152b may implement stereophonic sound functions in conjunction with the first audio output module 152a, and may be also used for implementing a speaker phone mode for call communication.

At least one antenna for wireless communication may be located on the terminal body. The antenna may be installed in the terminal body or formed by the case. For example, an antenna which configures a part of the broadcast receiving module 111 (see FIG. 1A) may be retractable into the terminal body. Alternatively, an antenna may be formed using a film attached to an inner surface of the rear cover 103, or a case that includes a conductive material.

A power supply unit 190 for supplying power to the mobile terminal 100 may include a battery 191, which is mounted in the terminal body or detachably coupled to an outside of the terminal body.

The battery 191 may receive power via a power source cable connected to the interface unit 160. Also, the battery 191 can be recharged in a wireless manner using a wireless charger. Wireless charging may be implemented by magnetic induction or electromagnetic resonance.

The rear cover 103 is shown coupled to the rear case 102 for shielding the battery 191, to prevent separation of the battery 191, and to protect the battery 191 from an external impact or from foreign material. When the battery 191 is detachable from the terminal body, the rear case 103 may be detachably coupled to the rear case 102.

An accessory for protecting an appearance or assisting or extending the functions of the mobile terminal 100 can be also provided on the mobile terminal 100. As one example of an accessory, a cover or pouch for covering or accommodating at least one surface of the mobile terminal 100 may be provided. The cover or pouch may cooperate with the display unit 151 to extend the function of the mobile terminal 100. Another example of the accessory is a touch pen for assisting or extending a touch input to a touch screen.

Generally, the antenna is arranged in a lower area of the mobile terminal 100. In case the antenna is loaded in the lateral surface of the mobile terminal 100, the antenna performance could be deteriorated in the user's holding the mobile terminal. In case it is arranged in an upper area, the upper surface having the antenna is likely to contact with the user's body during the call and the antenna becomes located near the user's brain. Because of that, the antenna is usually loaded in the lower area of the mobile terminal 100 which is located as far from the user's brain as possible.

The side case 105 formed of the metal may be may be used as the antenna radiator. In this instance, the length of the antenna radiator is important for the matching of the RF signal frequency. A non-metal material may be used in the other area except the metal part corresponding to the present length or the non-metal part may be separated from the metal part.

The width of the antenna radiator is important to enhance the antenna performance. As the antenna radiator becomes thicker and thicker, the transceiving efficiency of the antenna becomes better and better. In other words, the length of the antenna radiator is used as an important factor in determining the matching of the RF signal frequency and the width is used as another important factor in the efficiency. As the mobile terminal 100 becomes smaller, it is limited to form a thick metal part of the side case such that it may be also limited to increase the width of the antenna radiator by using the side case.

Among the components loaded in the mobile terminal, some having a conductive material might affect the performance of the antenna and then they may be loaded, spaced apart from the antenna radiator. The middle case 104 and the display unit 151 among the components loaded in the mobile terminal 100 may include the conductive material and the main board 181 may partially include the conductive material.

It is necessary to arrange the metal part of the side case 105 used as the antenna radiator, spaced a preset distance apart from the middle case 104 and the display unit 151.

Especially, the display unit 151 tends to become larger and the bezel (in other words, the edge area of the mobile terminal 100, except the display unit) tends to become smaller. If the display unit 151 becomes larger, the middle frame 104 supporting the rear area of the display unit 151 becomes also larger and this causes a problem that the middle frame 104 and the display unit 151 having the conductor gets closer to the antenna radiator (the metal part of the side case 105).

Figure 2A:
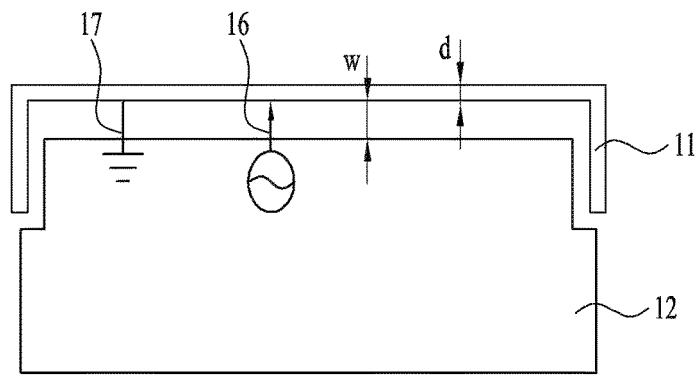
FIG. 2A is a diagram to describe the antenna performance according to the arrangement of an antenna radiator and a middle frame.

FIG. 2A is a diagram to describe the antenna performance according to the arrangement of the antenna radiator and the middle frame. To use the side case 11 as the antenna radiator, a feeding line 16 connected to the wireless communication unit and a grounding line 17 are connected to the side case 11. The middle frame 12 is located in the terminal body and then arranged in the side case 11, spaced a preset distance (w) apart as shown in FIG. 2A.

The conductive components are loaded in the inner area of the terminal body, except the middle frame 12 and the middle frame 12 occupying the largest area is arranged closest to the side case 11. Hereinafter, the embodiment will be described based on the distance between the middle frame 12 and the side case 11. The conductive components and the side case have to be also spaced a preset distance apart from each other as well as the middle frame 12, so as to secure the wireless communication performance.

Figure 2B:
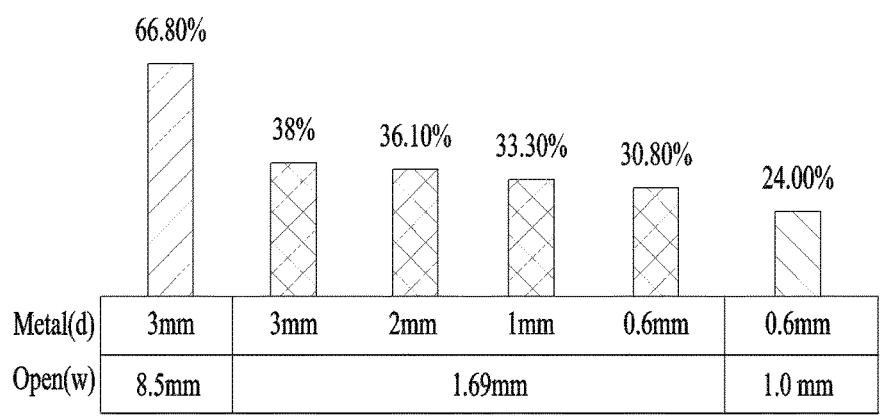
FIG. 2B is a graph illustrating the antenna performance according to the arrangement of the antenna radiator and the middle frame.

FIG. 2B is a graph illustrating the antenna performance according to the arrangement of the antenna radiator (side the case 11) and the middle frame. The graph shows the distance (w) between the metal part of the side case 105 employed as the antenna radiator and the middle frame 104 and a relation between the thickness (d) of the antenna radiator and the wireless communication performance.

When the thickness ('id' of FIG. 2A) of the metal part provided in the side case 11 employed as the antenna radiator may be 3 mm and the distance ('w' of FIG. 2A) between the middle frame 12 and the metal case is 8.5 mm, the wireless communication performance is 66.8%. The percentage means a relative value when the ideal efficiency is 100%.

When the distance (w) between the middle frame 12 and the metal case is 1.69 mm, the better performance is achieved with the thicker metal part and When the thickness (d) is thinner and the distance (w) is narrower, the efficiency falls to 24%. The present disclosure provides the mobile terminal 100 with an antenna radiator that may secure the antenna performance even when the thickness of the metal part of the side case 11 is 0.6 mm and the distance between the middle frame 12 and the side case 11 is 1 mm.

Figure 3A:
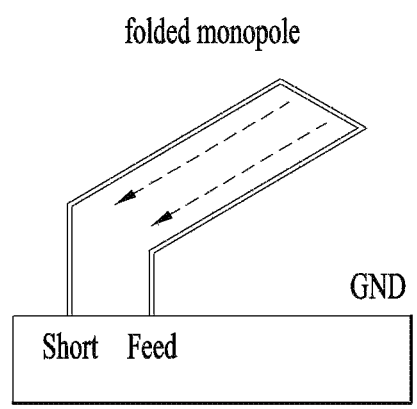
FIGS. 3A and 3B are diagrams to describe a type of a folded antenna.
Figure 3B:
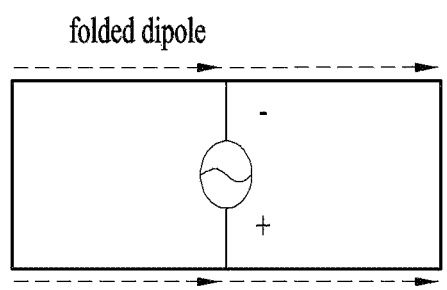

FIGS. 3A and 3b are diagrams to describe a configuration of a folded antenna. FIG. 3A is a diagram illustrating a folded dipole antenna and FIG. 3B is a diagram illustrating a folded monopole. The folded dipole antenna (shown in FIG. 3A) is connected to a positive pole (+) and a negative pole (−) and the length of the overall antenna is corresponding to the wavelength of the resonance frequency.

Meanwhile the folded monopole antenna (see FIG. 3B) is an improved type of a dipole antenna, with one end having an electric power applied thereto (in other words, a feed end) and a short type connected to a ground plane, instead of the negative pole (−). The ground plane is employed as a mirror and actuated as if it has a doubled length, compared with the actual length of the antenna radiator. Accordingly, the monopole antenna having only a ½ length of the dipole antenna may realize the same antenna with a 1 wavelength antenna.

Only when the antenna radiator length of the monopole antenna is corresponding to a ½ wavelength of a resonance frequency, the monopole antenna can secure the antenna performance. Accordingly, when the monopole antenna is loaded in a small sized product like the mobile terminal 100, it is advantageous to secure the antenna loading space.

The folded monopole is a type realized by bending an antenna radiator of a conventional monopole antenna as shown in FIGS. 3A and 3B. The monopole antenna has to be spaced a preset distance apart from the middle frame 104 in a doubled space. Accordingly, the folded monopole is used to as to reduce the loading space of the antenna radiator.

Figure 4A:
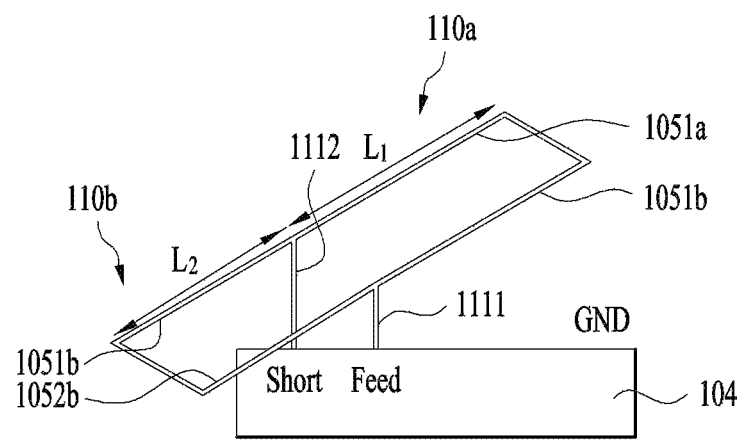
FIG. 4A is a conceptual diagram illustrating a dual mode folded mono-pole antenna.

FIG. 4A is a conceptual diagram illustrating a dual mode folded monopole antenna. The folded monopole occupies a small space as mentioned above. Using the side case 105, two folded monopole antenna may be realized (in other words, a dual mode).

A first antenna radiator 110a having a first length L1 and a second antenna radiator 110b having a second length L2 may be used as independent antenna radiators, respectively. More antennas may be loaded, compared with one antenna realized by using a lower end of the side case provided in the conventional mobile terminal.

Figure 5A:
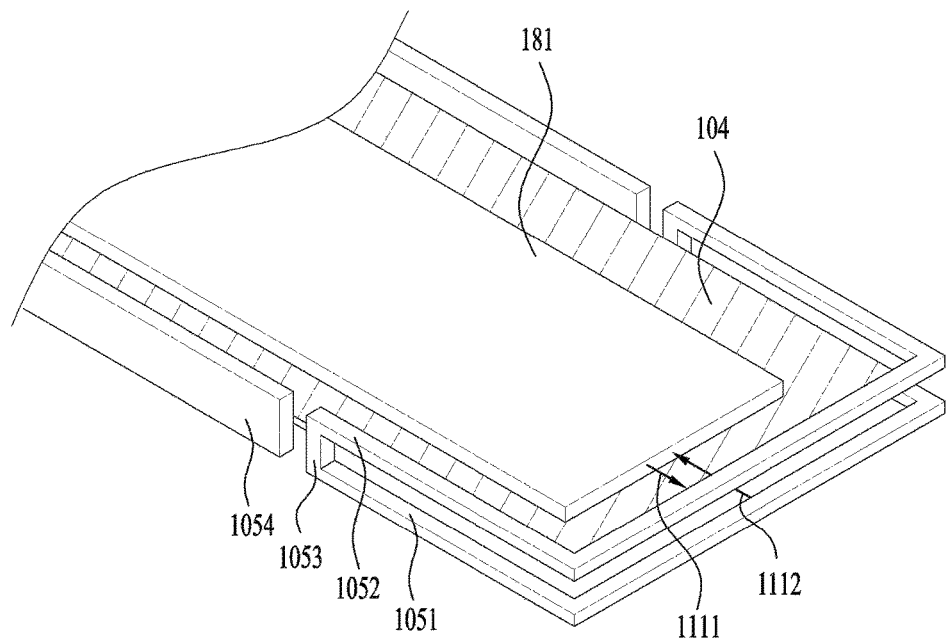
FIG. 5A is a perspective diagram illustrating a substantial configuration of one embodiment shown in FIG. 4A.
Figure 5B:
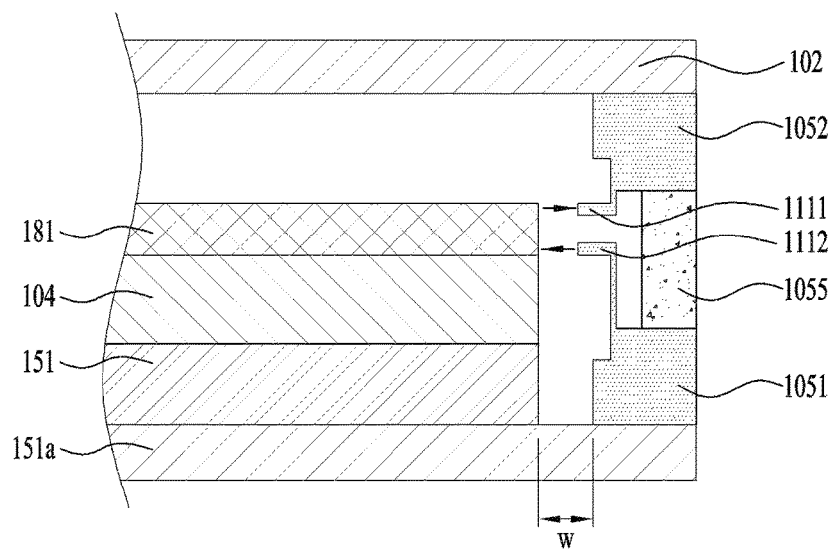
FIG. 5B is a sectional diagram of the embodiment shown in FIG. 4A.

The first antenna radiator 110a may transceive a signal at a frequency having a doubled length of L1 and the second antenna radiator may transceive a signal at a frequency having a doubled length of L2. FIG. 5A is a perspective diagram illustrating a substantial configuration of the embodiment shown in FIG. 4A and illustrating only the metal part 1051, 1052, 1053 and 1054 of the side case 105. FIG. 5B is a sectional diagram of the embodiment shown in FIG. 4A.

At least predetermined area of the side case 105 according to the present disclosure (some area of a first lateral surface and second and third lateral surfaces located in left and right sides to the first lateral surface) may be divided into three ends along a thickness direction of the mobile terminal 100 to be a first metal part 1051 adjacent to the rear case 102, a second metal part 1052 adjacent to the middle case 102 and a third metal rear 1053 adjacent to the window glass 151a. The first metal part 1051 and the second metal part 1052 are spaced a preset distance apart from each other, only to be divided into three layers (see FIGS. 1B and 1C).

A first non-metal part 1055 may be further provided between the first metal part 1051 and the second metal part 1052, only to form a layered structure configured of three layers along the thickness direction of the mobile terminal 100. A communication hole in communication with the internal space of the mobile terminal may be formed in the non-metal part 1055 such as an ear jack, the interface unit 160 or an audio hole for the audio output unit 152b.

Each of the first and second metal parts 1051 and 1052 may have both ends that are connected with each other by using a pair of third metal part 1053, to realize a folded antenna radiator. The first metal part 1051, the second metal part 1052 and the third metal part 1053 may be connected with each other in a shape of '☐' shown in FIG. 4A.

A second non-metal part 1056 may be disposed between a fourth metal part 1054 and the first through three metal parts 1051, 1052 and 1053 to separate the fourth metal part 1054 located in the other area of the side case 105 from the first, second and third metal parts 1051, 1052 and 1053.

A feeding line 1111 configured to feed a corresponding electric power to the signal generated in the wireless communication unit 110 may be connected to one of the first and second metal parts 1051 and 1052 and a first ground line 1112 configured to link to a ground unit may be connected to the other one. The ground unit may be provided in the main board 181 and connected to the middle frame 104 such that the middle frame 104 may also substantially function as the ground unit. Accordingly, the first ground line 1112 may substantially function as the ground unit of the middle frame 104 as well as the ground unit of the main board 181 according to the present disclosure. The ground line and the first feeding line 1111 may be integrally formed as one body by using a connection structure such as a C-clip or a pogo pin or welding.

In the structure of the enlarged display unit 151 and the minimized bezel, the middle frame 104 and the display unit 151 get close to the first and the second metal parts 1051 and 1052 of the side case 105 only to have a problem of a deteriorated wireless communication performance.

Figure 4B:
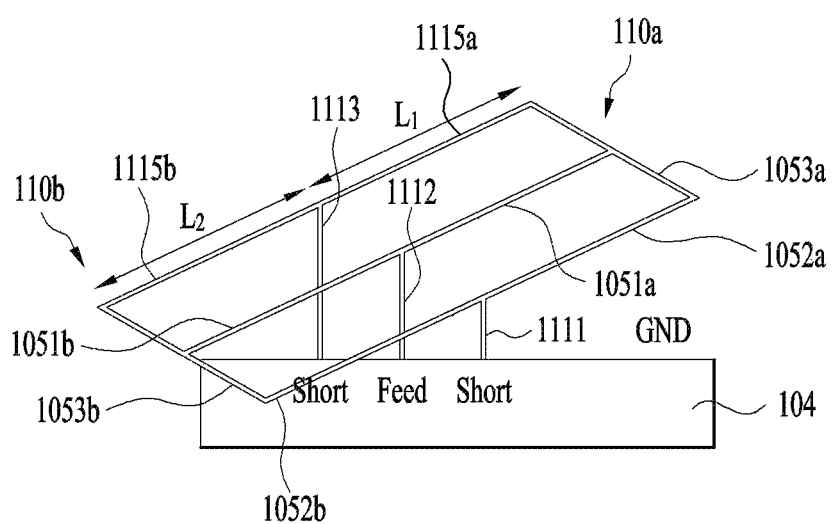
FIG. 4B is a conceptual diagram illustrating a multi-path folded mono-pole antenna of the mobile terminal.

To solve the problem, one path may be further formed to three paths as shown in FIG. 4B and a multi-path dual mode folded monopole antenna radiator may be then realized to improve the performance. When the number of the paths is increased, currents can flow more actively and the wireless communication function may be improved, which is similar to when the antenna volume is increased.

Figure 6A:
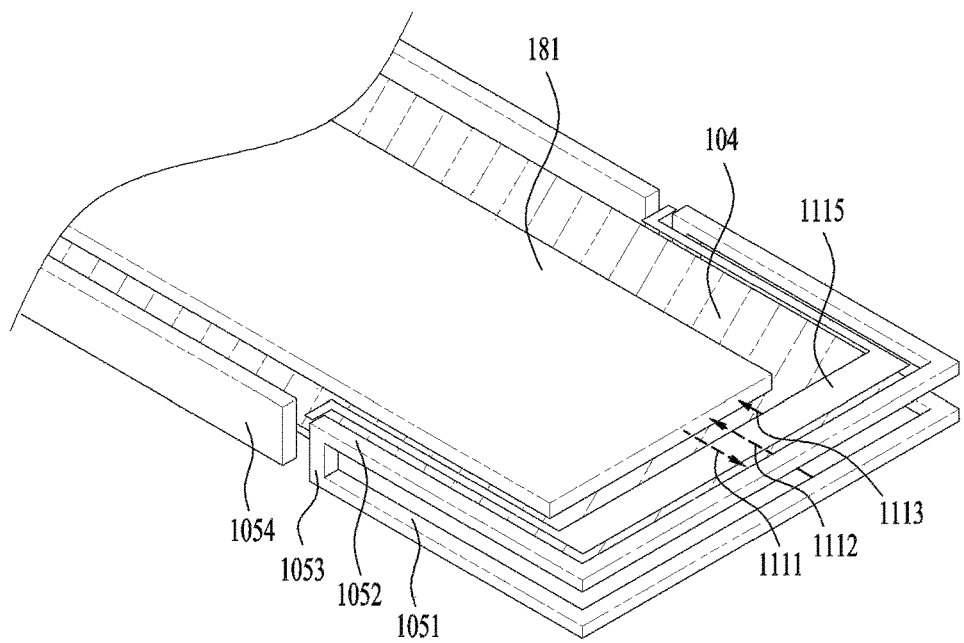
FIG. 6A is a perspective diagram illustrating a substantial configuration of one embodiment shown in FIG. 4B.
Figure 6B:
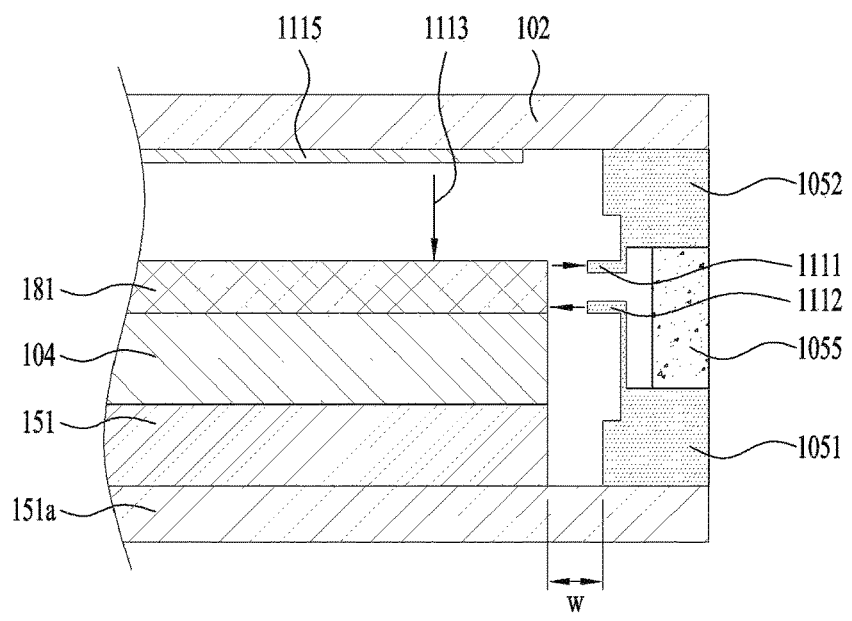
FIG. 6B is a sectional diagram of the embodiment shown in FIG. 4B.

FIG. 6A is a perspective diagram illustrating a substantial configuration of one embodiment shown in FIG. 4B and FIG. 6B is a sectional diagram of the embodiment shown in FIG. 4B. The illustrated embodiment may further include conductive pattern 1115 formed in an inner surface of the rear case 102, compared with the embodiment shown in FIGS. 5A and 5B. It is limited in the thickness of the mobile terminal 100 to form three paths in the side case 105. If the side case 105 is segmented into the three paths forcedly, the first metal part 1051 and the second metal part 1052 become thinner enough to deteriorate the performance. As shown in FIGS. 6A and 6B, an auxiliary conductive pattern 1115 may be formed in the inner surface of the rear case 102 to realize the third path of the multi-path folded monopole antenna.

Both ends of the conductive pattern 1115 may be connected to the first metal part 1051, the second metal part 1052 or the third metal part 1053 and the other sections except the ends may be arranged, spaced apart from members having the conductive material such as the metal parts 1051, 1052 and 1053 of the side case 105 and the middle case 104.

The conductive pattern 1115 may be connected with the middle frame 104 via a second ground line 1113 to be grounded. The second ground ling 1113 may be arranged in a similar position to the feeding line 1111 or the first ground line 1112. The reason why the second ground line 1113 is arranged in the similar position to the feeding line 1111 or the first ground line 1112 is to form the lengths of the paths similar to each other in the multi-path dual mode folded monopole antenna to form the same resonance frequency.

In other words, the length from the feeding line 1111 to the second metal part 1052, the conductive pattern 1115 and the second ground line 1113 may be formed similar to the length from the feeding line 1111 to the second metal part 1052, the third metal part 1053, the first metal part 1052 and the first ground line 1112.

FIG. 6B is a sectional diagram of A-A shown in FIG. 1C. In the drawing, a lower direction is the front surface of the mobile terminal 100 and an upper direction is the rear surface of the mobile terminal. From the front surface, the window glass 151a, the display unit 151, the middle frame 104, the main board 181 and the rear case 102 may be sequentially disposed. The side case 105 for surrounding the lateral surface may be located. The side case 105 may have the multi-layered structure configured of the first metal part 1051, the second non-metal part 1055 and the second metal part 1052.

The electric power corresponding to the RF signal may be supplied to the first metal part 1051 from the wireless communication unit 110 loaded in the main board 181 via the feeding line 1111. The ground unit of the main board 181 may be connected with the second metal part 1052 via the first ground line 1112. The first ground line 1112 may be directly connected to the middle frame 104 located in the front surface of the main board 181.

Figure 7:
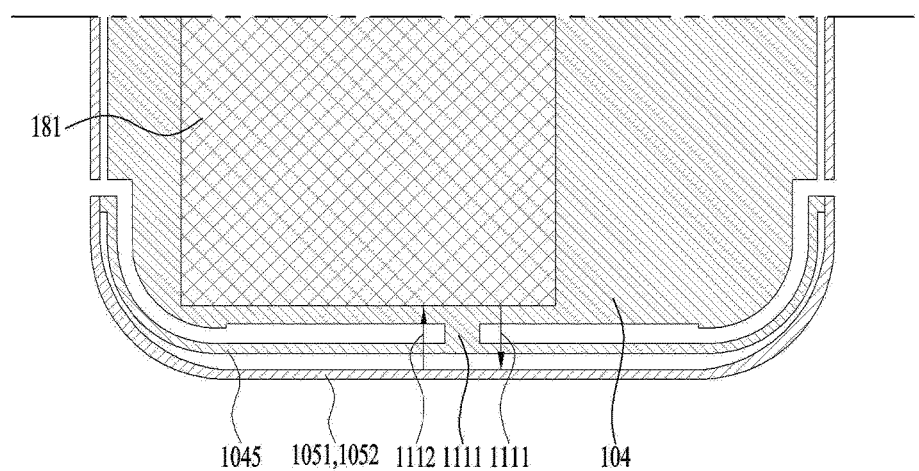
FIG. 7 is a plane view illustrating one modified embodiment shown in FIGS. 6A and 6B.

FIG. 7 is a plane view illustrating a modified embodiment of FIGS. 6A and 6B. Instead of the conductive pattern 1115 formed in the inner surface of the rear case 102, the middle frame 104 may be partially processed to form the conductive pattern 1115. To distinguish the conductive pattern 1115 formed in the inner surface of the rear case 102 mentioned above, some area of the middle frame 104 is cut away and formed in a bar shape, which is called 'a metal strip 1045'.

The area of the middle frame 104 near the second metal part 1052 may be processed in the bar shape to form a metal strip 1045. The metal strip 1045 may be connected with the middle frame 104 by using the second ground line 1113 located in a similar position to the feeding line 1111 or the first ground line 1112. The second ground line 1113 shown in FIG. 7 may be integrally formed with the middle frame 104 and the metal strip 1045. In other words, when the metal strip 1045 is formed by processing the middle frame 104, the second ground line 113 may be left to connect the metal strip 1045 to the middle frame 104.

As such the type of the antenna radiator uses the side case 105 exposed outside, it could be difficult to change the exterior design so as to match the signal with the precise frequency. Accordingly, the antenna may be tuned to generate resonance in a frequency that is desired to be used by extending the length of the antenna radiator after an additional pattern formed of an auxiliary conductive material is connected with the first metal part 1111 or the second metal part 1112.

Figure 8:
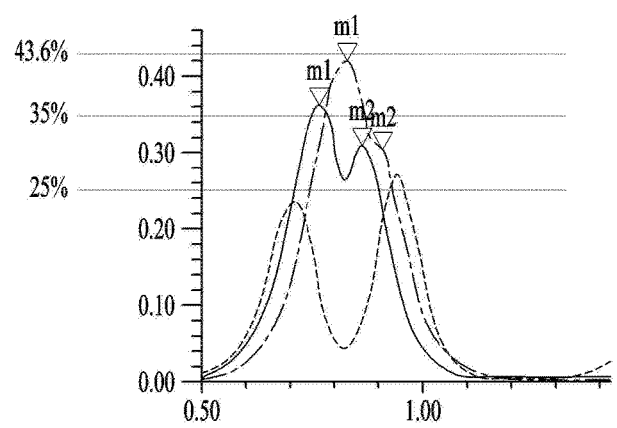
FIG. 8 is a diagram illustrating the efficiency of the antenna shown in FIGS. 4A and 4B.

FIG. 8 is a diagram illustrating the efficiency of the antenna shown in FIGS. 4A and 4b. A dotted line refers to the efficiency of the antenna shown in FIG. 4A and a solid line refers to the antenna efficiency shown in FIG. 4B. Compared with the case of the two paths, the case of the three paths increases the efficiency from 25% to 35%. The efficiency of a vertical axis refers to a relative performance when an ideal value is 100%.

Referring to the drawings shown in FIGS. 4A and 4B, a signal at a frequency having a corresponding wavelength to the distance L1 and L2 to the second metal part 1052, the third metal part 1053, the first metal part 1051 and the first and second ground lines 1112 and 1113 from the feed line 1111 may be transceived. A signal at a frequency having a doubled wavelength of L1 and L2 may be transceived. When using the signal at the frequency having the doubled wavelength, the size of the antenna can be reduced advantageously. In other words, L1 or L2 may be a resonance frequency which allows a signal having a wavelength of $\lambda1/2$ or $\lambda2/2$ to implement wireless communication via the antenna radiator.

When L1 is different from L2, resonance occurs in different frequency bands and two resonance points appear as shown in a dotted line graph and a solid line graph of FIG. 8.

At this time, when the length of L1 is changed to be similar to that of L2, the resonance frequencies become closer enough to overlap the resonance frequencies with each other as shown a solid line graph of (b) and the efficiency may be enhanced to show 42.6% of efficiency. As the two antennas having three paths, respectively, transceive signals, the wireless communication performance is improved. For the effect of the performance improvement caused by the overlapping, it is preferred that a difference between the lengths of L1 and L2 is adjusted within 10%.

Especially, the antenna according to the present disclosure can enhance the efficiency of the signals in a low band when matching the frequency to a signal in the low band of 1 GHz or less, the efficiency of the low band signal may be enhanced. As the low band signal has a relatively long wavelength, it is difficult to secure the performance. However, when using the antenna according to the present disclosure, the wireless communication performance of the low band signal may be enhanced.

If the lengths of L1 and L2 are similar with each other, it is disadvantageous not to transceive signals in several frequency bands. Even when realized in other antennas, it is relatively difficult to secure the performance of a high frequency band signal. In the terms of the low band performance improvement that is the most difficult, the overall wireless communication performance may be enhanced.

Figure 9:
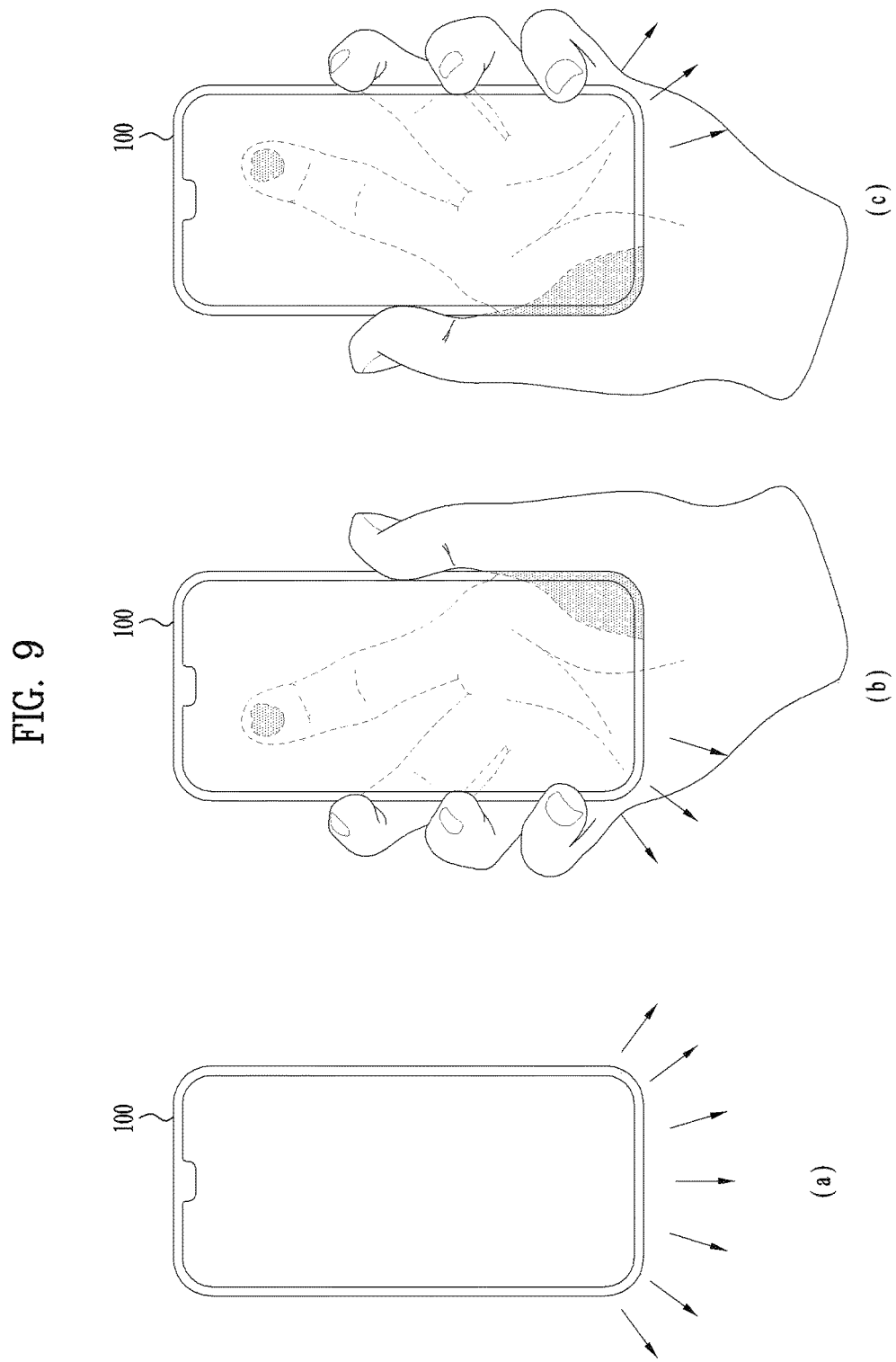
FIG. 9 is a diagram to describe the radiation performance of the antenna realized in a side case provided in a lower end of the mobile terminal when a user holds the mobile terminal.

FIG. 9 is a diagram to describe the radiation performance of the antenna realized in the side case 105 provided in a lower end of the mobile terminal 100 when a user holds the mobile terminal 100. Unless the user is holding as shown in (a), the signal may be transceived without interference. When the user is holding as shown in (b) or (c), signal radiation may not be performed properly in the area where the hand touches a lot (e.g., a palm area near the thumb or a dotted square area).

Figure 10A:
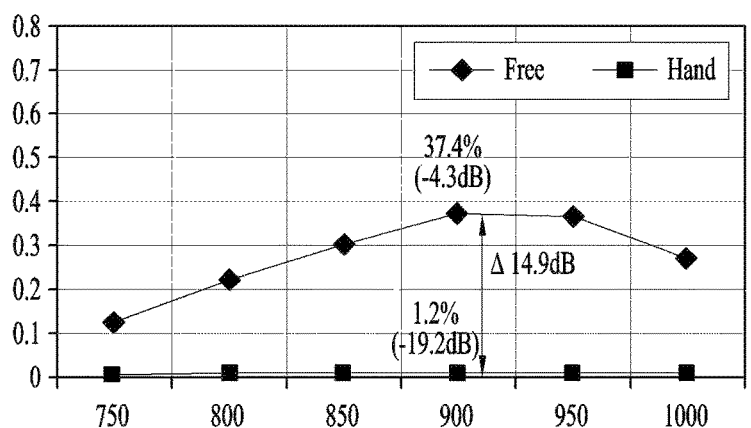
FIG. 10A is a graph illustrating the performances unless the user holds a conventional mobile terminal and when the user's hand touches the side case in holding the conventional mobile terminal in the hand.
Figure 10B:
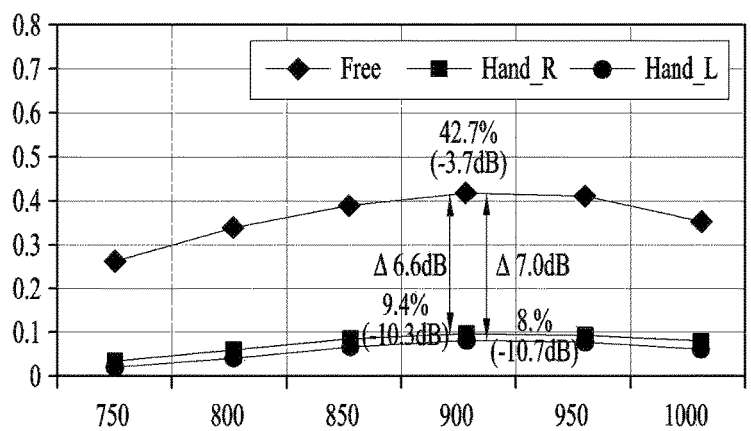
FIG. 10B is a graph illustrating the performances unless the user holds the mobile terminal and when the user's hand touches the side case in holding the mobile terminal in the hand.

FIG. 10A is a graph illustrating the performances unless the user holds a conventional mobile terminal and when the user's hand touches the side case in holding the conventional mobile terminal in the hand. FIG. 10B is a graph illustrating the performances unless the user holds the mobile terminal 100 and when the user's hand touches the side case 105 in holding the mobile terminal 100 in the hand.

It is shown in FIGS. 10A and 10B that the antenna performance falls noticeably. As electric currents flow in the user's hand, the resonance frequency is changed and the signals flow to the user's hand without being radiated. Accordingly, the resonance frequency is not changed and no signals are radiated, while signals flow to the user's hand, such that the antenna performance may be deteriorated.

The conventional mobile terminal 100 shown in FIG. 10A has the performance deteriorated to approximately 14.9 dB. However, the mobile terminal according to the present disclosure shown in FIG. 10B has the performance deteriorated only to 6.6-7 dB. As the conventional mobile terminal 100 includes only one antenna, the radiation performance is deteriorated. However, when the lengths of the left and right paths are similar to each other in the mobile terminal according to the present disclosure, the radiation may be performed in both of the left and right paths. Even if the antenna performance of one antenna is deteriorated, the other antenna is able to transceive the signal and the antenna performance may be secured, compared with the performance of the conventional mobile terminal. Also, the conductive pattern 1115 the user's hand will not reach may not be in contact with the user's hand directly, even when the user is holding the mobile terminal. Accordingly, the wireless communication performance may be maintained to a preset level.

Figure 11:
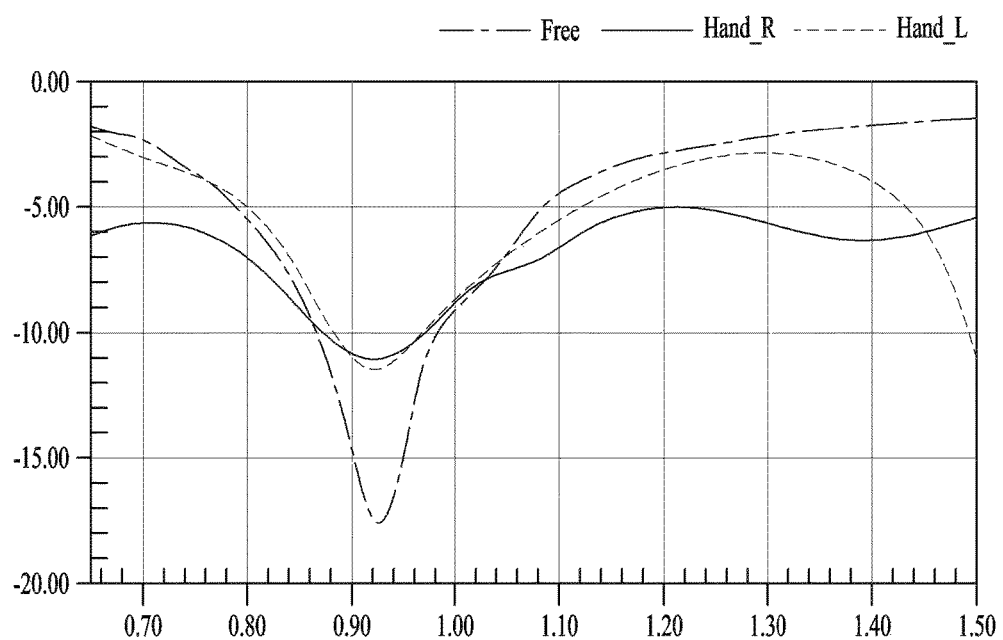
FIG. 11 is a graph illustrating the resonance frequency when the user holds the mobile terminal according to the present disclosure in the hand.

FIG. 11 is a graph illustrating the resonance frequency when the user holds the mobile terminal according to the present disclosure in the hand. Even when the user is holding the mobile terminal 100, the resonance frequency will not move to the left and right. As mentioned above, even if the performance of one antenna is deteriorated by the user's hand, the other antenna will resonate in the original frequency and the resonance frequency will not be changed advantageously.

Figure 12:
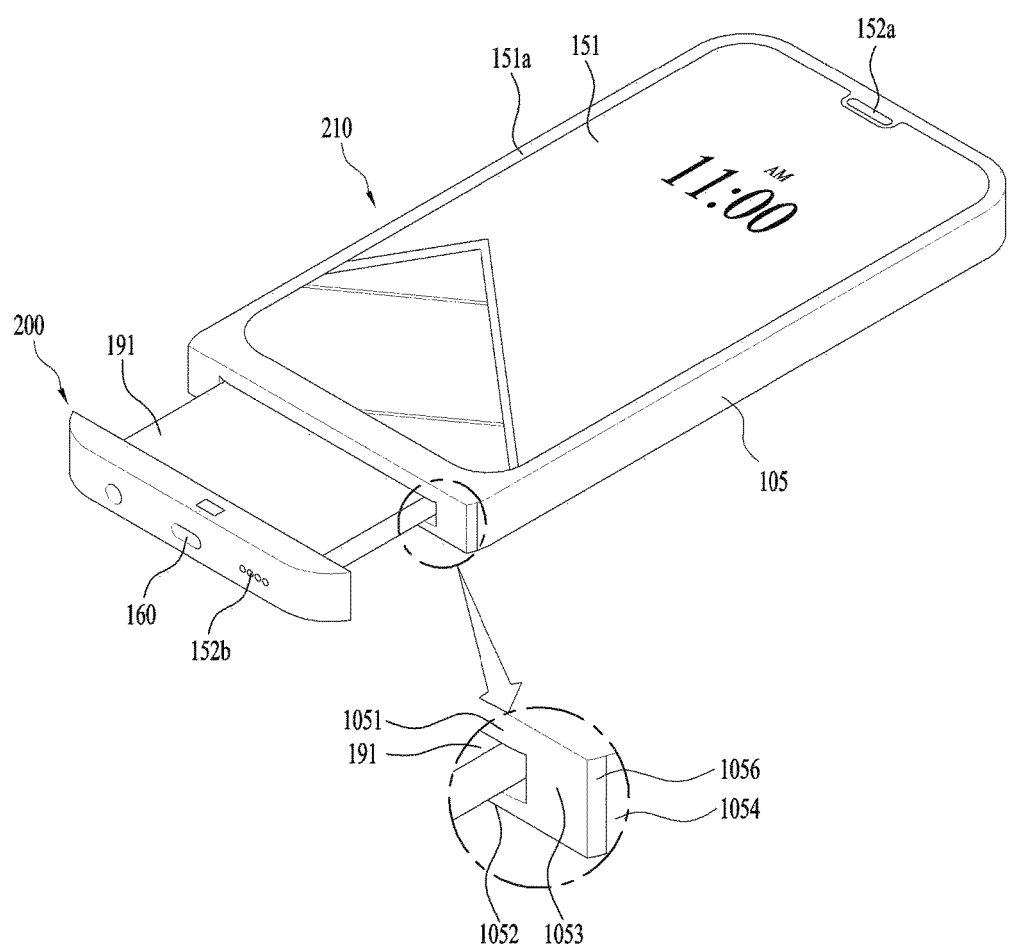
FIG. 12 is a diagram illustrating a mobile terminal in accordance with another embodiment.
Figure 13:
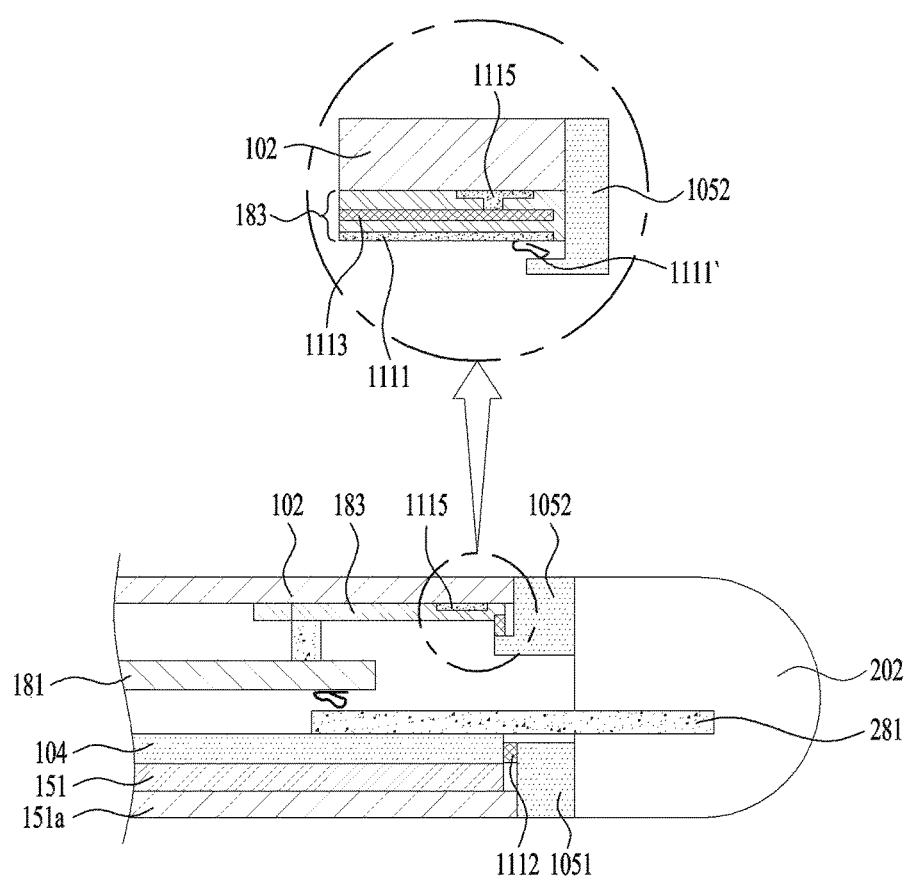
FIG. 13 is a sectional diagram of the mobile terminal in accordance with the embodiment shown in FIG. 12.

FIG. 12 is a diagram illustrating a mobile terminal 100 in accordance with another embodiment. FIG. 13 is a sectional diagram of the mobile terminal 100 in accordance with the embodiment shown in FIG. 12. In the illustrated embodiment, the antenna according to the present disclosure is realized in a unit type mobile terminal 100 of which upper and lower units are separated. Main parts including the display unit 151 and the main board 181 are disposed in the upper unit. The speaker or some user input unit 123, the microphone 122 and the interface unit 160 may be disposed in the lower unit 202. The battery 191 is mounted in the lower unit 202 and the lower unit 202 having the battery is insertedly coupled to the upper unit 201. Accordingly, the battery 191 may be replaced without a battery cover realized in the rear surface of the mobile terminal.

The antenna according to the present disclosure may be loaded in a lower end of the upper unit 201, without the first non-metal part 1055 provided between the first metal part 1051 and the second metal part 1052 according to the above-described embodiment. The battery 191 and the board 281 of the lower unit 202 may be inserted between the first metal part 1051 and the second metal part 1052.

The battery 191 and the board 281 of the lower unit 202 which are inserted there between may be connected to the main board 181 of the mobile terminal 100 to supply the electric power and control the components of the lower unit 202 or transmit the information collected in the lower unit 202 to the main board 181 of the upper unit.

To couple the lower unit 202 to the upper unit 201, a predetermined space has to be provided in the lower end of the upper unit 201. The first metal part 1051, the second metal part 1052 and the main board 181 are spaced apart as shown in FIG. 12. Accordingly, it becomes difficult to directly connect the feed line 1111 and the first ground line 1112 to the main board, the first metal part 1051 and the second metal part 1052 like the above-described embodiment.

In this embodiment, the first ground line 1112 is directly connected to the first metal part 1051 and the middle frame 104 to ground the first metal part 1051. The feed line 1111 is connected by using a flexible substrate connecting the second metal part 1052 and the main board 181 with each other.

On the flexible substrate 183 may be realized the conductive pattern 1115, the second ground line 1113 connecting the conductive pattern 1115 with the ground unit of the main board 181 and the first ground line connecting the second metal part 1052 with the wireless communication unit 110 loaded in the main board 181. Especially, the flexible substrate 183 is configured of a plurality of conductive layers such that the conductive pattern 1115, the second ground line 1113 and the feed line 1111 may be realized on different layers, respectively. The flexible substrate 183 and the second metal part 1052 may be connected by using a C-clip.

FIG. 14A through 16B are diagrams illustrating a mobile terminal in accordance with a further embodiment.

Figure 14A:
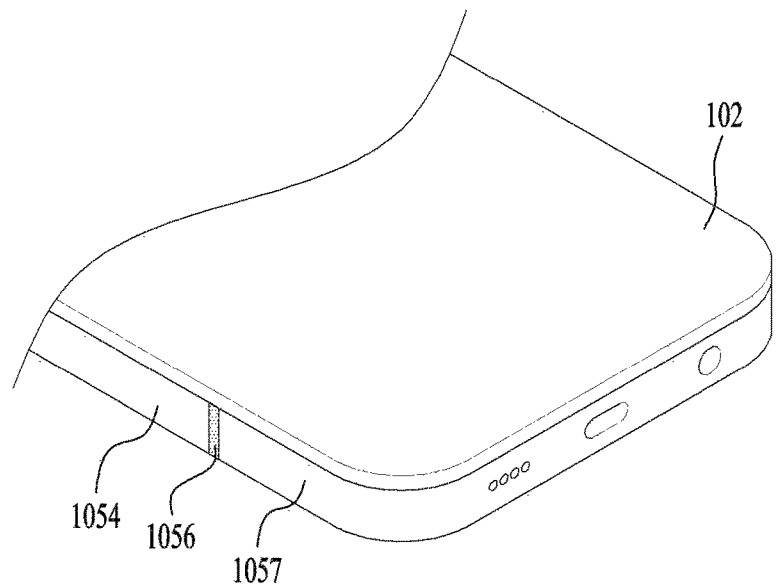
FIG. 14A through 16B are diagrams illustrating a mobile terminal in accordance with a further embodiment.
Figure 14B:
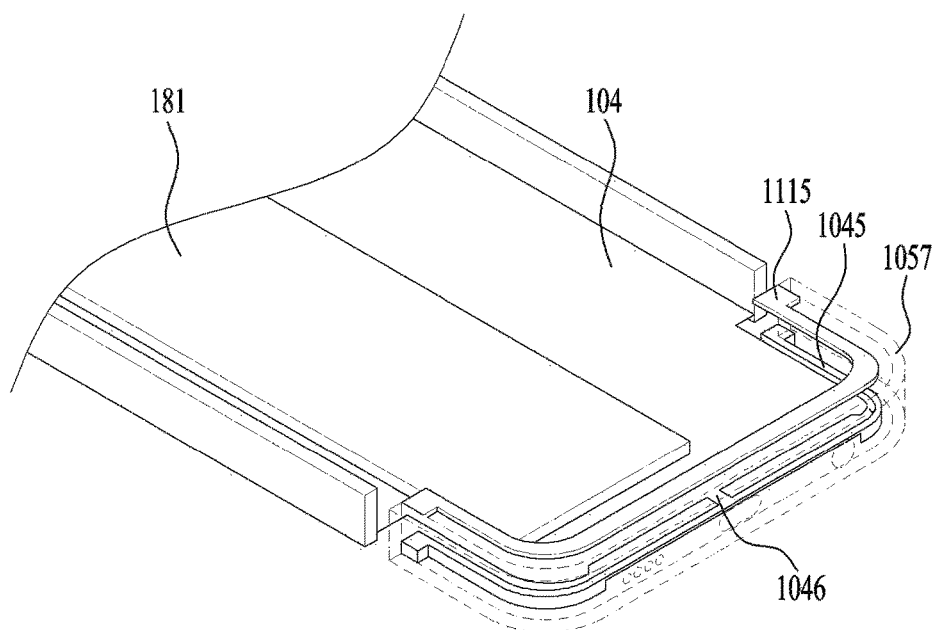

The mobile terminal 100 according to the embodiment shown in FIGS. 14A and 14B includes a metal part 1057 integrally formed as one body shown in FIG. 14A, not segmented into the three layers mentioned in the above embodiment.

The metal part 1057 not divided into the first metal part 1051 and the second metal part 1052 is used as one path. The other two paths are realized by using the conductive pattern shown in FIG. 6 and the metal strip 1045 processed from the middle frame 104 shown in FIG. 7, such that the three paths may be realized. The metal strip 1045 may be connected with the middle frame 104 via the ground line. The metal part 1057 of the side case 105 may be connected via the feed line 1111 and the conductive pattern 1115 may be connected via the ground line. Accordingly, the antenna having the structure shown in FIG. 4B may be configured.

Such the structure may simplify the area exposed outside and provide the mobile terminal 100 having the exterior design with the unity, while realizing the pair of the antennas having the three paths (or the multi-path dual mode folded monopole antenna). The wireless communication performance may be enhanced similarly to the above-described embodiment. Even when the user is holding the mobile terminal, the performance will not be deteriorated advantageously.

Figure 15A:
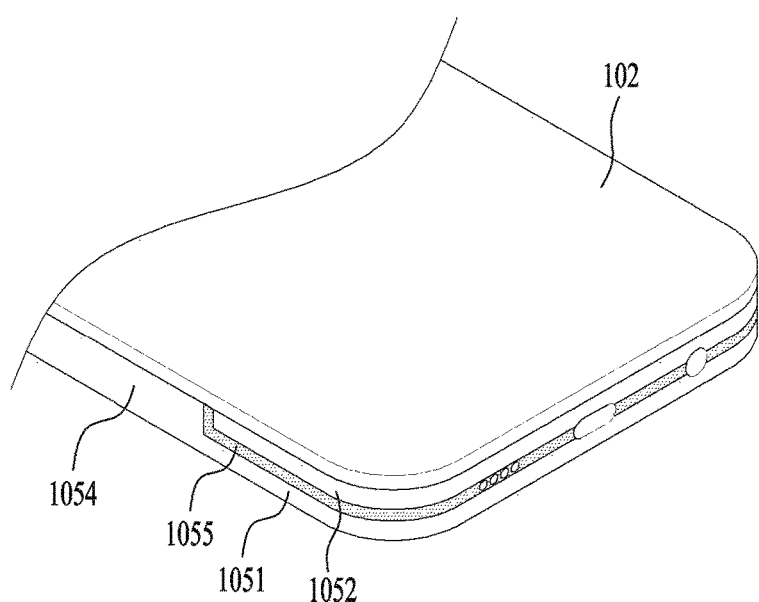
Figure 15B:
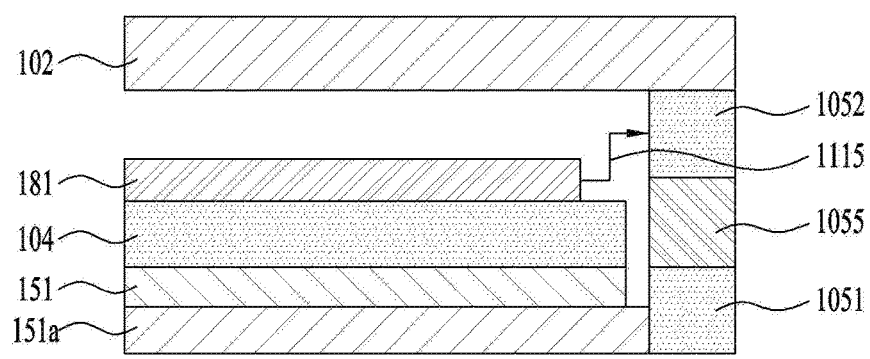

The embodiment shown in FIGS. 15A and 15B may not have the three paths but provide a bezeless mobile terminal 100 of which the side case 105 include a non-metal part to secure the antenna area.

In the embodiment shown in FIGS. 15A and 15B, the side case 105 includes the first metal part 1051, the second metal part 1052 and the first non-metal part 1055 provided between the first and second metal parts 1051 and 1052. Instead of the third metal part 1053, the first metal part 1051 may be connected with the fourth metal part 1054 and only the second metal part 1052 may be used as the antenna.

Figure 16A:
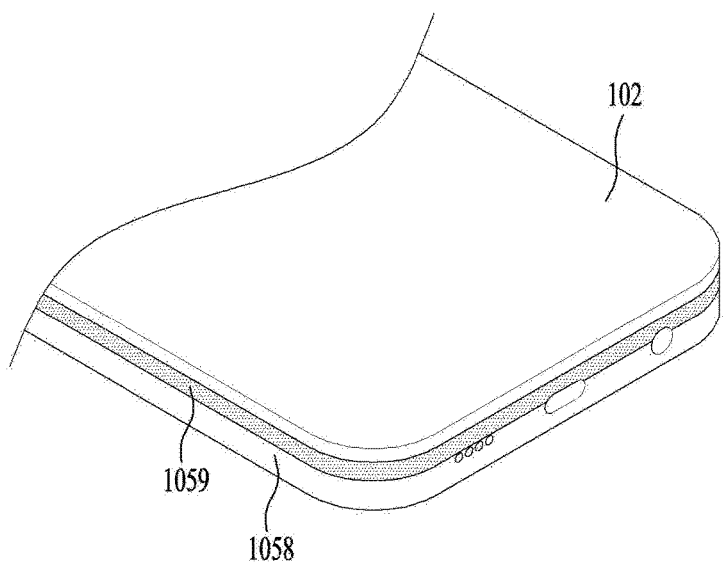
Figure 16B:
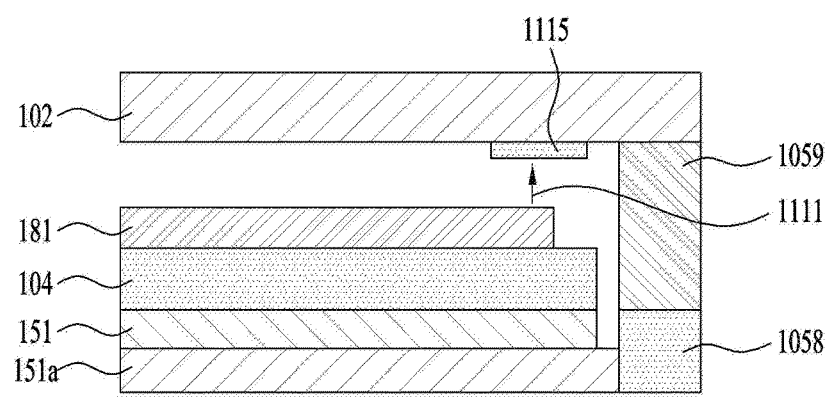

The embodiment shown in FIGS. 16A and 16B provides a two-layer structure that a non-metal part 1059 is formed adjacent to the rear case 102 and the metal part 1058 is formed adjacent to the window glass 151. The conductive pattern 1115 may be formed in the inner surface of the rear case 102 that is partially open and the conductive pattern 1115 may be connected to the wireless communication unit 110, only to realize the antenna.

Figure 17:
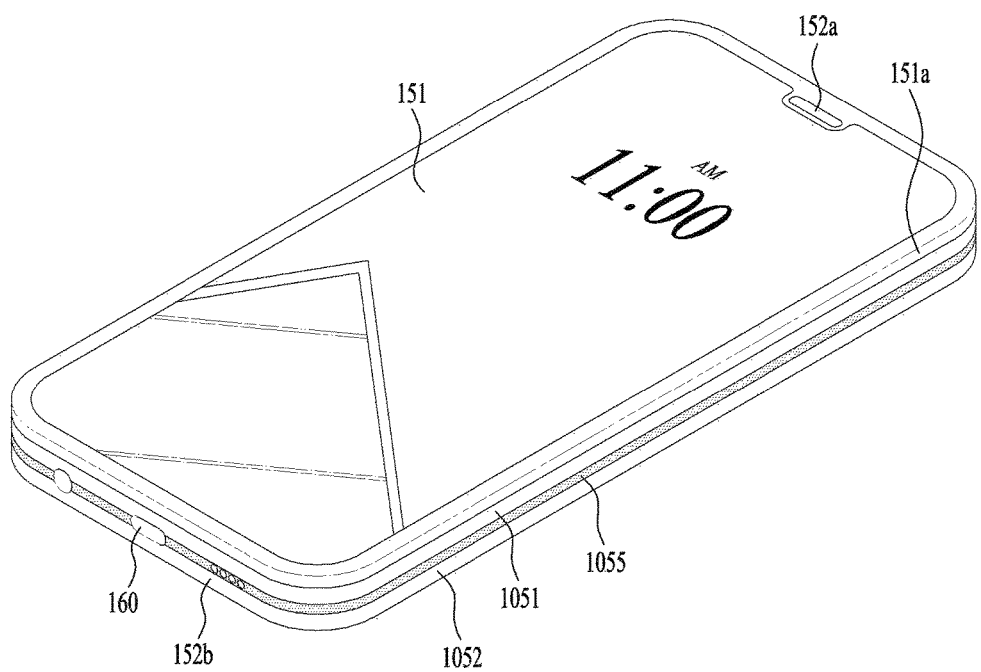
FIG. 17 is a perspective diagram illustrating a still further embodiment.
Figure 18:
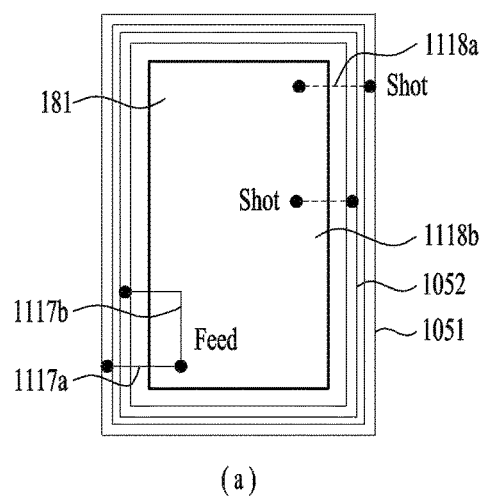
FIG. 18 is a conceptual diagram of the mobile terminal in accordance with the embodiment shown in FIG. 17.
Figure 18:
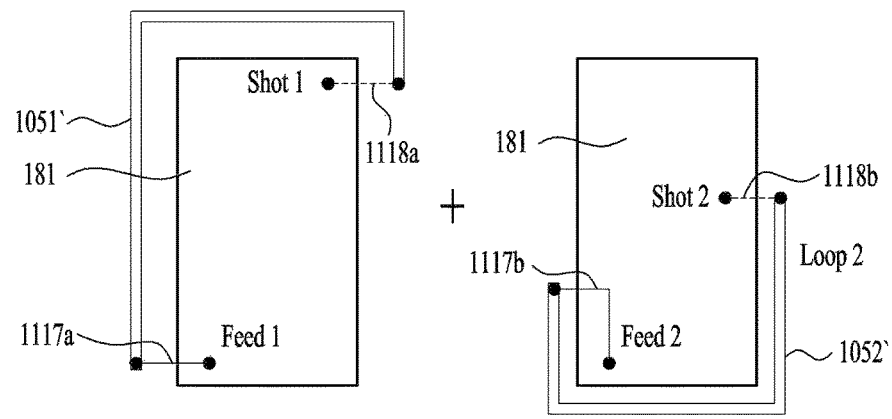

FIG. 17 is a perspective diagram illustrating a still further embodiment and FIG. 18 is a conceptual diagram of the mobile terminal 100 in accordance with the embodiment shown in FIG. 17.

The side case 1-5 of the mobile terminal 100 according to this embodiment may include the first metal part 1051, the second metal part 1052 and the first non-metal part 1055 that are extended along the overall lateral surface of the mobile terminal 100, not having the partially layered structure.

The first metal part 1051 and the second metal part 1052 in such the structure may be formed of a ring-shaped conductor having both ends facing each other in contact as shown in FIG. 18. When the feed line 1111 and the ground line are connected to the ring-shaped metal part, the area located between the feed line 1111 and the ground line may be functioned as the antenna radiator.

As shown in FIG. 18 (*a*), the feed line 1111 and the ground line are connected to the first metal part 1051 and the second metal part 1052, respectively. The areas segmented into the segment in which the feed line 1111 is connected with the first metal part 1051 and the other one in which the ground line is connected with the second metal part 1052 may be used as the antenna. Referring to FIG. 18 (*b*), the first antenna radiator is corresponding to the segment to the ground line 11118*a* from the feed line 1117 a connected with the first metal part 1051. The second antenna radiator is corresponding to the segment from the feed line 1117*b* connected with the second metal part 1052 to the ground line 1117*c*. In other words, the side case 105 according to the present disclosure may realize the antenna which may transceive signals at different frequency bands. When the length of the first antenna radiator is different that of the second antenna radiator, the two antennas may be provided in the same frequency band. Even if the user holds one of the antennas, the resonance frequency will not be changed and the deterioration of the wireless communication performance may be prevented.

A first antenna radiator and a fourth antenna radiator configured to transceive signals in different frequency bands may be further realized by connecting the ground line and the feed line with the other areas of the first and second metal parts 1051 and 1052, except the area used as the first and second antenna radiators.

As mentioned above, the mobile terminal can expand the antenna function and then secure the antenna function even the antenna is provided near peripheral components.

Furthermore, the mobile terminal can realize the plurality of antenna radiators having independent paths, respectively, and then control another radiator to transceive a signal even if the performance of one radiator is deteriorated. Accordingly, the wireless communication function of the mobile terminal may be enhanced.

As the present features may be embodied in several forms without departing from the characteristics thereof, it should also be understood that the above-described embodiments are not limited by any of the details of the foregoing description, unless otherwise specified, but rather should be considered broadly within its scope as defined in the appended claims, and therefore all changes and modifications that fall within the metes and bounds of the claims, or equivalents of such metes and bounds, are therefore intended to be embraced by the appended claims.

What is claimed is:

1. A mobile terminal comprising:
   a housing comprising a rear case provided in a rear surface of the housing and a side case provided in a lateral surface of the housing;
   a display unit disposed on a front surface of the housing;
   a window glass configured to cover the display unit and the front surface of the housing;
   a main board loaded in the housing; and
   a wireless communication unit loaded in the main board and configured to process a wireless signal,
   wherein the side case comprises:
   a first metal part; and
   a second metal part disposed apart from the first metal part in a thickness direction of the housing, wherein the first metal part and the second metal part are placed at a first lateral surface and extended to a predetermined area of a second lateral surface located in a left side of the first lateral surface and a predetermined area of a third lateral surface located in a right side of the first lateral surface, and
   wherein one of the first and second metal parts is connected with the wireless communication unit and configured to transceive a RF signal.

2. The mobile terminal of claim 1, wherein the side case further includes a first non-metal part provided between the first metal part and the second metal part, and
   wherein the first metal part, the first non-metal part and the second metal part form a layered structure along the thickness of the mobile terminal.

3. The mobile terminal of claim 2, further comprising:
   a hole formed in the first non-metal part; and
   one or more of an interface and an earphone jack arranged in the hole.

4. The mobile terminal of claim 2, further comprising:
   a feed line connected with the second metal part and configured to transceive a RF signal,
   wherein both ends of the first non-metal part are bent towards the second metal part and extended to both ends of the second metal part.

5. The mobile terminal of claim 1, wherein the side case further comprises:
   a pair of third metal parts provided to connect the first metal part and both ends of the second metal part.

6. The mobile terminal of claim 5, wherein the side case further comprises:
   a fourth metal part spaced apart from the first metal part, the second metal part and the third metal part; and
   a second non-metal part disposed between the third metal part and the fourth metal part.

7. The mobile terminal of claim 6, further comprising:
   a feed line connected with the second metal part and configured to transceive a RF signal; and a first ground line connected with the first metal part and configured to operate as a ground.

8. The mobile terminal of claim 7, wherein a signal is transceived at a frequency having a length L1 from the feed line to the second metal part, the third metal part, the first metal part and the first ground line in a first direction or a length L2 to the second metal part, the third metal part, the first metal part and the first ground line in a second direction or a doubled length of L1 and L2.

9. The mobile terminal of claim 7, wherein a difference between the length L1 from the feed line to the second metal part, the third metal part, the first metal part and the first ground line in the first direction and the length L2 to the second metal part, the third metal part, the first metal part and the first ground line in a second direction is 10% or less.

10. The mobile terminal of claim 7, further comprising:
a conductive pattern having both ends connected with the second metal part; and
a second ground line connected with the conductive pattern and configured to operate as a ground.

11. The mobile terminal of claim 10, wherein the conductive pattern is formed in an inner surface of the rear case.

12. The mobile terminal of claim 10, wherein the length from the feed line to the second metal part, the conductive pattern and the second ground line corresponds to the length from the feed line to the second metal part, the third metal part, the first metal part and the first ground line.

13. The mobile terminal of claim 7, further comprising:
a middle frame formed of metal and disposed on a rear surface of the display unit,
wherein the conductive pattern and the second ground line are formed by cutting away a predetermined area of the middle frame.

14. The mobile terminal of claim 1, further comprising:
a lower unit provided in a direction in which the first metal part and the second metal part of the housing are formed; and
a battery projected from the lower unit and inserted in a space between the first metal part and the second metal part.

15. The mobile terminal of claim 1, further comprising:
a flexible substrate configured to connect the second metal part with the main board,
wherein the flexible substrate comprises:
a feed line connected with the second metal part and configured to transceive a RF signal;
a conductive pattern having both ends contacting the second metal part; and
a second ground line connected with the conductive pattern and configured to operate as a ground.

16. The mobile terminal of claim 1, further comprising:
a first feed line and a second feed line connected with the first metal part and the second metal part, respectively, and configured to transceive a RF signal; and
a first ground line and a second ground line connected with the first metal part and the second metal part, respectively, and configured to operate as a ground,
wherein the first metal part and the second metal part are continuously formed around the lateral surface of the mobile terminal in a ring shape.

17. The mobile terminal of claim 16, wherein the wireless communication unit transceives a RF signal having a wavelength corresponding to the length of the first metal part from the first feed line and the first ground line or the length of the second metal part from the second feed line to the second ground line.

18. The mobile terminal of claim 16, wherein the side case further comprises:
a first non-metal part provided between the first metal part and the second metal part and formed in a ring shape.

* * * * *